(12) United States Patent
Takahashi et al.

(10) Patent No.: US 8,049,292 B2
(45) Date of Patent: Nov. 1, 2011

(54) SEMICONDUCTOR DEVICE AND METHOD FOR MANUFACTURING SEMICONDUCTOR DEVICE

(75) Inventors: Hidekazu Takahashi, Tochigi (JP); Daiki Yamada, Gunma (JP); Yohei Monma, Tochigi (JP); Takahiro Iguchi, Tochigi (JP); Hiroki Adachi, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 274 days.

(21) Appl. No.: 12/404,376

(22) Filed: Mar. 16, 2009

(65) Prior Publication Data

US 2009/0267173 A1    Oct. 29, 2009

(30) Foreign Application Priority Data

Mar. 27, 2008    (JP) .................... 2008-083056

(51) Int. Cl.
*H01L 31/048* (2006.01)

(52) U.S. Cl. ......... 257/440; 257/E23.131; 257/E25.005; 257/E31.121

(58) Field of Classification Search .......... 257/440, 257/E31.11, E31.121, E25.005, E23.121, 257/E23.131
See application file for complete search history.

(56) References Cited

U.S. PATENT DOCUMENTS

| | | | |
|---|---|---|---|
| 5,261,156 A | 11/1993 | Mase et al. | |
| 5,401,330 A | 3/1995 | Saito et al. | |
| 5,483,987 A | 1/1996 | Amaudric du Chaffaut et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,834,327 A | 11/1998 | Yamazaki et al. | |
| 6,118,502 A | 9/2000 | Yamazaki et al. | |
| 6,224,965 B1 | 5/2001 | Haas et al. | |
| 6,362,866 B1 | 3/2002 | Yamazaki et al. | |
| 6,403,221 B1 | 6/2002 | Nakamura et al. | |
| 6,798,030 B1 * | 9/2004 | Izumi et al. ................... | 257/428 |
| 6,855,961 B2 | 2/2005 | Maruyama et al. | |

(Continued)

FOREIGN PATENT DOCUMENTS

EP    1092739    4/2001

(Continued)

OTHER PUBLICATIONS

US 7,359,010, 04/2008, Yamazaki et al. (withdrawn)

*Primary Examiner* — Benjamin Sandvik
*Assistant Examiner* — Wensing Kuo
(74) *Attorney, Agent, or Firm* — Eric J. Robinson; Robinson Intellectual Property Law Office, P.C.

(57) ABSTRACT

A semiconductor device includes a plurality of semiconductor integrated circuits bonded to a structure body in which a fibrous body is impregnated with an organic resin. The plurality of semiconductor integrated circuits are provided at openings formed in the structure body and each include a photoelectric conversion element, a light-transmitting substrate which has stepped sides and in which the width of the projected section on a first surface side is smaller than that of a second surface, a semiconductor integrated circuit portion provided on the second surface of the light-transmitting substrate, and a chromatic color light-transmitting resin layer which covers the first surface and part of side surfaces of the light-transmitting substrate. The plurality of semiconductor integrated circuits include the chromatic color light-transmitting resin layers of different colors.

36 Claims, 16 Drawing Sheets

U.S. PATENT DOCUMENTS

| | | |
|---|---|---|
| 6,882,012 B2 | 4/2005 | Yamazaki et al. |
| 6,900,873 B2 | 5/2005 | Yamazaki et al. |
| 7,049,178 B2 | 5/2006 | Kim et al. |
| 7,050,138 B1 | 5/2006 | Yamazaki et al. |
| 7,067,395 B2 | 6/2006 | Maruyama et al. |
| 7,214,555 B2 | 5/2007 | Yamazaki et al. |
| 7,271,858 B2 | 9/2007 | Yamazaki et al. |
| 7,352,044 B2 | 4/2008 | Yamada et al. |
| 7,446,843 B2 | 11/2008 | Yamazaki et al. |
| 7,471,368 B2 | 12/2008 | Yamazaki et al. |
| 7,485,489 B2 | 2/2009 | Björbell |
| 2003/0071953 A1 | 4/2003 | Yamazaki et al. |
| 2005/0070038 A1 | 3/2005 | Yamazaki et al. |
| 2005/0121672 A1 | 6/2005 | Yamazaki et al. |
| 2005/0233122 A1 | 10/2005 | Nishimura et al. |
| 2006/0044300 A1 | 3/2006 | Koyama et al. |
| 2006/0065960 A1 | 3/2006 | Maruyama et al. |
| 2006/0270195 A1 | 11/2006 | Yamada et al. |
| 2007/0115416 A1 | 5/2007 | Yamazaki et al. |
| 2008/0188022 A1 | 8/2008 | Yamazaki et al. |
| 2008/0224940 A1 | 9/2008 | Sugiyama et al. |
| 2008/0224941 A1 | 9/2008 | Sugiyama et al. |
| 2008/0242005 A1 | 10/2008 | Dozen et al. |

FOREIGN PATENT DOCUMENTS

| | | |
|---|---|---|
| EP | 1589797 | 10/2005 |
| JP | 07-014880 | 1/1995 |
| JP | 07-331983 | 12/1995 |
| JP | 08-250745 | 9/1996 |
| JP | 08-264796 | 10/1996 |
| JP | 10-092980 | 4/1998 |
| JP | 2001-064029 | 3/2001 |
| JP | 2003-255386 | 9/2003 |
| JP | 2007-331983 | 12/2007 |
| WO | WO 01/01740 | 1/2001 |
| WO | WO 2004/001848 | 12/2003 |

* cited by examiner

US 8,049,292 B2

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing a semiconductor device. In particular, the present invention relates to a semiconductor device including a photoelectric conversion element.

2. Description of the Related Art

Among a variety of sensors, sensors which detect visible light with a wavelength of 400 to 700 nm are referred to as optical sensors or visible light sensors. Optical sensors or visible light sensors are known to be used for, for example, detecting optical signals to read data, detecting ambient brightness to control operation of electronic appliances, and the like.

For example, in cellular phones or television units, optical sensors are used for adjusting the luminance of display screens in accordance with the ambient brightness of places where they are set.

Such a semiconductor device typified by the optical sensor or the visible light sensor is formed in such a manner that transistors are formed over a substrate such as a glass substrate or a wafer substrate, and then the substrate is cut (divided).

In general, a step of cutting a substrate is performed as follows: a groove is formed on a surface of a substrate (referred to as scribing) with a scribing device and the substrate is cut along the groove. As a scribing method, a method using a laser is given as well as a mechanical method using a diamond cutter or the like. In the case of the method using a laser, after local application of heat with a laser, an irradiated region is rapidly quenched, so that the substrate is cracked due to thermal stress generated in the substrate. Further, a method is proposed, in which a short-pulse laser is used as a laser and a rapid quenching step is omitted to prevent the substrate from being thermally strained in the rapid quenching step (for example, see Patent Document 1: Japanese Published Patent Application No. 2007-331983).

SUMMARY OF THE INVENTION

However, a semiconductor device is likely to be damaged due to external stress such as pressure applied in any of steps for manufacturing a semiconductor device except a step of cutting a substrate, or a step of inspecting the semiconductor device. The thinner and the weaker a substrate is, the more frequently damages such as cracks, chaps, and chips are generated.

Further, a blade of a dicer (a dicing blade) or the like used as a scribing device is expensive and, moreover, is required to be changed because it is worn away after being used a plurality of times. Therefore, it is difficult to reduce manufacturing cost.

In view of the above problems, an object is to reduce damages of a semiconductor device, such as cracks, chaps, and chips due to external stress. Another object is to reduce the thickness of a substrate provided with a semiconductor device. Another object is to increase manufacturing yield of a semiconductor device reduced in thickness. Another object is to reduce manufacturing cost of a semiconductor device reduced in thickness.

In the present invention, a substrate provided with a plurality of semiconductor integrated circuit portions is divided between the semiconductor integrated circuit portions, so that a plurality of semiconductor integrated circuits are taken out in chip forms.

The semiconductor integrated circuit portion is an integrated circuit portion including a plurality of semiconductor elements and includes a stack of thin films such as an insulating film, a semiconductor film, and a conductive film. In the present invention, the plurality of the semiconductor integrated circuit portions are provided to be aligned over one substrate which has not been divided yet.

A semiconductor integrated circuit includes a photoelectric conversion element and a chromatic color light-transmitting resin, and a plurality of semiconductor integrated circuits having chip forms are bonded to a structure body in which a fibrous body is impregnated with an organic resin.

A structure body in which a fibrous body is impregnated with an organic resin is also referred to as a prepreg. A prepreg is specifically formed as follows: after a fibrous body is impregnated with a varnish in which a matrix resin is diluted with an organic solvent, drying is performed so that the organic solvent is volatilized and the matrix resin is semi-cured. The thickness of the structure body is preferably larger than or equal to 10 μm and smaller than or equal to 100 μm, more preferably larger than or equal to 10 μm and smaller than or equal to 30 μm. By using the structure body with such a thickness, a thin semiconductor device capable of being bent can be manufactured.

A structural body is heated and subjected to pressure bonding so that the organic resin of the structure body is plasticized or cured. Note that in the case where the organic resin is an organic plastic resin, the organic resin which has been plasticized is cured by being cooled to a room temperature. By heating and pressure bonding, the organic resin is uniformly spread so as to be in close contact with a semiconductor integrated circuit and is cured. A step in which the structure body is subjected to pressure bonding is performed under an atmospheric pressure or a reduced pressure. The organic resin may be a photocurable material. After being in close contact with the semiconductor integrated circuit, the organic resin is cured by light irradiation and bonded.

Since the plurality of semiconductor integrated circuits to be bonded to the structure body in which a fibrous body is impregnated with an organic resin can be freely selected, the semiconductor integrated circuits including chromatic color light-transmitting resins of different colors are bonded to the structure body in which a fibrous body is impregnated with an organic resin, so that a semiconductor device including semiconductor integrated circuits of a plurality of colors, each of which has a function of a color sensor, can be manufactured.

For example, a semiconductor integrated circuit including a red light-transmitting resin, a semiconductor integrated circuit including a green light-transmitting resin, and a semiconductor integrated circuit including a blue light-transmitting resin are bonded to the structure body in which a fibrous body is impregnated with an organic resin, so that a semiconductor device including semiconductor integrated circuits each including a photoelectric conversion element which detects red (R) light, green (G) light, or blue (B) light can be manufactured.

Further, a semiconductor integrated circuit can be subjected to an inspection step before being bonded to the structure body in which a fibrous body is impregnated with an organic resin, so that only a conforming product can be selected and bonded to the structure body in which a fibrous body is impregnated with an organic resin. Thus, yield of a semiconductor device is increased in a manufacturing process. Particularly in the case of a structure in which the semiconductor integrated circuit includes a semiconductor integrated circuit portion including a complicated structure such as an amplifier circuit, since there is a possibility that defects are generated in the semiconductor integrated circuit having a chip form, it is effective that the semiconductor integrated circuit can be inspected for defects before being bonded to the structure body in which a fibrous body is impregnated with an organic resin. Further, a high-quality semiconductor integrated circuit is selected from among conforming products to be bonded to the structure body in which a fibrous body is impregnated with an organic resin, so that a higher-quality semiconductor device can be manufactured.

Further, a semiconductor integrated circuit according to an embodiment of the present invention has a structure in which at least a chromatic color light-transmitting resin layer covers a surface of a light-transmitting substrate, which is the reverse of the surface on which a semiconductor integrated circuit portion is formed and a part of an end portion (side surface) of the light-transmitting substrate. Thus, the light-transmitting resin layer also functions as a shock absorbing layer which absorbs external stress such as pressure which is applied in a manufacturing step or in the inspection step, so that defects such as a scratch and a crack of the semiconductor integrated circuit can be reduced, and a semiconductor device with high reliability can be manufactured.

In a method for dividing into semiconductor integrated circuits, according to an embodiment of the present invention, first, a light-transmitting substrate is processed to be thin so that the time required for the division is reduced and wear of a process means such as a dicer used for the division is suppressed. Further, a dividing step is not performed at one time. First, a groove for dividing semiconductor integrated circuit portions is formed in the light-transmitting substrate, and a light-transmitting resin layer is formed over the light-transmitting substrate provided with the groove. After that, the light-transmitting resin layer and the light-transmitting substrate are cut along the groove, and divided into the plurality of semiconductor integrated circuits. The light-transmitting resin layer is a coloring layer of chromatic color which functions as at least a color filter, and a transparent light-transmitting resin layer may be further stacked over the light-transmitting layer as a shock absorbing layer.

Chromatic colors are colors except chromatic colors such as black, gray, and white. The coloring layer is formed using a material which transmits only light of a chromatic color with which the material is colored in order to function as a color filter. As a chromatic color, red, green, blue, or the like can be used. Alternatively, cyan, magenta, yellow, or the like may be used.

When a light-blocking material is used for the structure body in which a fibrous body is impregnated with an organic resin, the structure body in which a fibrous body is impregnated with an organic resin can function as a light-blocking film.

An embodiment of a semiconductor device of the present invention includes a plurality of semiconductor integrated circuits bonded to a structure body in which a fibrous body is impregnated with an organic resin. The plurality of semiconductor integrated circuits are provided in openings formed in the structure body and each include a light-transmitting substrate having a step section on a first surface and in which the width of the step section (a projected portion) on the first surface side is smaller than that of the other portion, a semiconductor integrated circuit portion including a photoelectric conversion element provided on a second surface of the light-transmitting substrate, and a chromatic color light-transmitting resin layer which covers the first surface and part of side surfaces of the light-transmitting substrate. The plurality of semiconductor integrated circuits include the chromatic color light-transmitting resin layers of different colors. The cross section of the light-transmitting substrate can also be said to have a shape of upside-down T in block letter. The projected portion refers to an upper portion of the light-transmitting substrate in the case where the surface of the light-transmitting substrate, on which the semiconductor integrated circuit portion is formed, faces downward.

If the cross section of the light-transmitting substrate is a shape of upside-down T in block letter, the light-transmitting resin layer can be provided so as to fill the cut portion of the end portion of the light-transmitting substrate.

An embodiment of a semiconductor device of the present invention includes a plurality of semiconductor integrated circuits bonded to a structure body in which a fibrous body is impregnated with an organic resin. The plurality of semiconductor integrated circuits are provided in openings formed in the structure body and each include a light-transmitting substrate one surface of which is a top surface and another surface of which is a bottom surface and the light-transmitting substrate has stepped sides and a trapezoid cross section in which the thickness of an upper portion is smaller than the thickness of a lower portion, a semiconductor integrated circuit portion including a photoelectric conversion element provided on the bottom surface of the light-transmitting substrate, and a chromatic color light-transmitting resin layer which covers the top surface and part of side surfaces of the light-transmitting substrate. The plurality of semiconductor integrated circuits include the chromatic color light-transmitting resin layers of different colors. Depending on the shape of a groove formed in the manufacturing process of the semiconductor integrated circuit, the trapezoid shape of the light-transmitting substrate of the semiconductor integrated circuit is curved from the upper portion to the lower portion.

In the trapezoid cross section of the light-transmitting substrate, when the trapezoid is curved from the upper portion to the lower portion, coverage of the curved portion with the light-transmitting resin layer is good.

In the case where the light-transmitting resin layer in contact with the light-transmitting substrate is a chromatic color light-transmitting resin layer and another light-transmitting resin layer is further formed over the light-transmitting resin layer, there are advantageous effects that the light-transmitting resin layer functions as a protective layer and has an excellent shock absorbing property, and deterioration of the chromatic color light-transmitting resin layer can also be prevented. The thickness of the light-transmitting resin layer functioning as a shock absorbing layer may be larger than that of the light-transmitting resin layer functioning as a coloring layer. By being formed to be thick, the light-transmitting resin layer functioning as a shock absorbing layer can be further increased in shock absorption property. On the other hand, the thickness of the chromatic color light-transmitting resin layer is preferably controlled in order that the chromatic color light-transmitting resin layer may function as a coloring layer (color filter) in consideration of the relation between the concentration of the coloring material to be included and transmissivity of light.

In the above structure, an embodiment of the semiconductor device may be that the side surface of the light-transmitting substrate in contact with the light-transmitting resin layer is a curved surface which spreads toward the bottom. The light-transmitting substrate has the curved side surface which spreads toward the bottom, whereby the light-transmitting resin layer can be provided so as to cover the curved side surface. Further, a bottom surface and a top surface of the light-transmitting substrate are quadrangles, and the area of the bottom surface is larger than that of the top surface. In the light-transmitting substrate of a semiconductor device in this specification, the surface in contact with a light-transmitting resin layer is referred to as a top surface, and the surface provided with the semiconductor integrated circuit portion is referred to as a bottom surface. In the case where the area of the bottom surface of the light-transmitting substrate is larger than that of the top surface of the light-transmitting substrate, the light-transmitting resin layer can be formed on a side surface in the region where the bottom surface and the top surface do not overlap with each other so as to cover the light-transmitting substrate.

As thus described, the semiconductor device of the present invention has a complicated shape; therefore, top and bottom sides of the semiconductor device can be easily distinguished. Thus, misidentification even in an automatic operation by a machine can be reduced.

Further, the semiconductor integrated circuit includes an amplifier circuit for amplifying the output of the photoelectric conversion element. The photoelectric conversion element may have a layered structure in which a p-type semiconductor layer, an i-type semiconductor layer, and an n-type semiconductor layer are stacked.

In this specification, an i-type semiconductor corresponds to the semiconductor in which the concentration of an impurity which imparts p-type or n-type conductivity is $1 \times 10^{20}$ $cm^{-3}$ or less; the concentration of oxygen and nitrogen is $1 \times 10^{20}$ $cm^{-3}$ or less; and photoconductivity exceeds dark conductivity by 100 times or more. The i-type semiconductor may include an impurity element which belongs to Group 13 or Group 15 of the periodic table. That is, the i-type semiconductor has weak n-type electric conductivity when an impurity element for controlling valence electrons is not added intentionally. Therefore, an impurity element imparting p-type conductivity may be added to an i-type semiconductor layer intentionally or unintentionally at the time of film formation or after the film formation.

A method for manufacturing a semiconductor device, according to an embodiment of the present invention, includes the following steps: cutting out a first semiconductor integrated circuit including a first chromatic color light-transmitting resin layer and a first photoelectric conversion element from a first light-transmitting substrate; cutting out a second semiconductor integrated circuit including a second chromatic color light-transmitting resin layer and a second photoelectric conversion element from a second light-transmitting substrate; cutting out a third semiconductor integrated circuit including a third chromatic color light-transmitting resin layer and a third photoelectric conversion element from a third light-transmitting substrate; providing the first semiconductor integrated circuit, the second semiconductor integrated circuit, and the third semiconductor integrated circuit into openings in a structure body in which a fibrous body is impregnated with an organic resin; and bonding the first semiconductor integrated circuit, the second semiconductor integrated circuit, and the third semiconductor integrated circuit to the structure body in which a fibrous body is impregnated with an organic resin. The first chromatic color light-transmitting resin layer, the second chromatic color light-transmitting resin layer, and the third chromatic color light-transmitting resin layer include different coloring materials.

In the above structure, before the first semiconductor integrated circuit, the second semiconductor integrated circuit, and the third semiconductor integrated circuit are bonded to the structure body in which a fibrous body is impregnated with an organic resin, an inspection step may be performed on the first semiconductor integrated circuit, the second semiconductor integrated circuit, and the third semiconductor integrated circuit. A semiconductor device can be formed by bonding a conforming product selected through the inspection step to the structure body in which a fibrous body is impregnated with an organic resin.

In the above structure, the first semiconductor integrated circuit, the second semiconductor integrated circuit, and the third semiconductor integrated circuit are formed by forming a plurality of semiconductor integrated circuit portions over each of the first light-transmitting substrate, the second light-transmitting substrate, and the third light-transmitting substrate. The thickness of each of the first light-transmitting substrate, the second light-transmitting substrate, and the third light-transmitting substrate is reduced. A groove is formed on each of the first light-transmitting substrate, the second light-transmitting substrate, and the third light-transmitting substrate and the groove is overlapped with a portion between the plurality of semiconductor integrated circuit portions. The first chromatic color light-transmitting resin layer, the second chromatic color light-transmitting resin layer, and the third chromatic color light-transmitting resin layer are formed over the first light-transmitting substrate, the second light-transmitting substrate, and the third light-transmitting substrate in each of which the groove is formed, respectively. Each of the groove of the first light-transmitting substrate and the first chromatic color light-transmitting resin layer, the groove of the second light-transmitting substrate and the second chromatic color light-transmitting resin layer, and the groove of the third light-transmitting substrate and the third chromatic color light-transmitting resin layer are cut.

In the case where an alignment marker is formed on the light-transmitting substrate when the light-transmitting substrate in which a groove is formed and the light-transmitting resin layer are cut, precision of a place to be cut can be improved by cutting the light-transmitting substrate and the light-transmitting resin layer from the light-transmitting substrate side by a cutting means such as a dicer.

In either of the step of forming the groove and the step of dividing the light-transmitting substrate, a dicer, a scriber, or the like can be used as a cutting tool. A dicer is preferably used. In a step of forming a groove with a dicer and a step of dividing a light-transmitting substrate between semiconductor integrated circuit portions with a dicer, a dicing blade is used. The edge of the dicing blade used in the step of forming a groove is thicker than that of the dicing blade used in the step of dividing the light-transmitting substrate. That is to say, when cutting traces are compared, the cutting trace in the step of forming a groove is wider than that in the step of dividing the light-transmitting substrate. The meaning of a cutting trace here is the width of a groove in the case of a groove, and is the width of the region where a light-transmitting substrate member is lost between elements before and after division in the case of the step of dividing the light-transmitting substrate when the light-transmitting substrate is fixed (also referred to as the width of a cut surface).

In a step of polishing the light-transmitting substrate to reduce the thickness, any of a glass polishing machine, a glass grinding machine, and the like is used in suitable combination. Wear of a dicing blade can be reduced by this polishing step. In addition, by providing the light-transmitting resin layer, generation of a crack in a desired element can be suppressed when a thin light-transmitting substrate is handled and divided. Moreover, a scratch and a crack in the case where the semiconductor integrated circuits having chip forms hit each other in being handled after division can be reduced, and yield in a visual examination of the semiconductor device can be increased. Furthermore, since the thickness of the light-transmitting substrate after division is small, the semiconductor device on which a semiconductor integrated circuit according to an embodiment of the present invention is mounted can be reduced in thickness.

Since the cutting trace in the step of forming a groove is wider than that in the step of dividing the light-transmitting substrate, the resin layer can be left on an end surface of the light-transmitting substrate when the light-transmitting substrate is divided in the step of dividing the light-transmitting substrate. That is, the resin layer is formed in the region of the side surface of the light-transmitting substrate, in which a groove is formed. On the other hand, the surface on which a semiconductor integrated circuit portion is formed and the region where the light-transmitting substrate is in contact with a dicing blade when the dicing blade is used in the dividing step are not covered with the resin layer.

According to an embodiment of the present invention, a resin covers a surface of a light-transmitting substrate which is the reverse of the surface on which a semiconductor integrated circuit portion is formed and a region of the side surface of the light-transmitting substrate, whereby generation of a scratch and a crack can be reduced and thus a semiconductor device can be formed with high yield.

Therefore, a highly reliable semiconductor device which is easily treated although it is thin can be provided.

Before the light-transmitting substrate is divided, the thickness of the light-transmitting substrate is reduced, and the dividing step is performed in two steps, so that wear of a cutting tool when the light-transmitting substrate is processed and divided can be reduced. Since the region which is processed by the cutting tool increases as the size of the light-transmitting substrate increases and as the size of each of semiconductor integrated circuits which are obtained by division is reduced, the cutting tool wears out further. Therefore, an embodiment of the present invention by which wear of the cutting tool can be reduced is particularly beneficial to a large substrate and a smaller semiconductor integrated circuit. Therefore, a semiconductor device can be manufactured at low cost. The thickness of a semiconductor device can be reduced because the thickness of the light-transmitting substrate is small.

DETAILED DESCRIPTION OF THE INVENTION

Figure 1A:
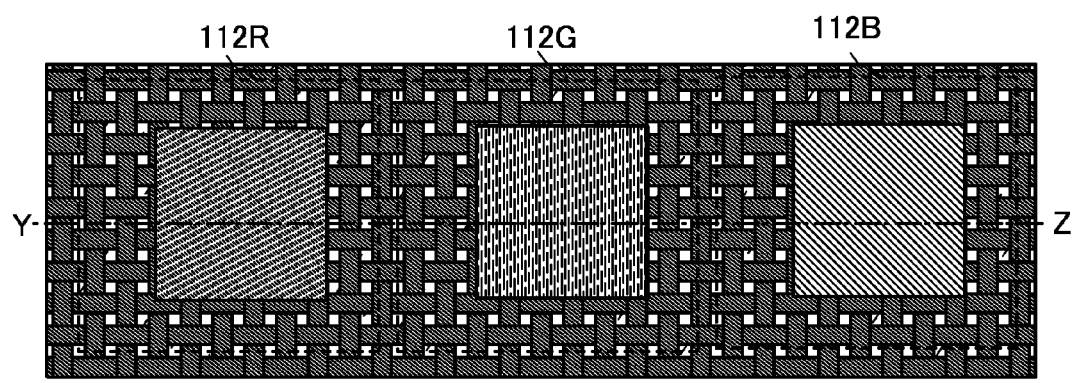
FIGS. 1A and 1B illustrate a semiconductor device according to an embodiment of the present invention.

The embodiments of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiments. Note that a common reference numeral refers to the same part or a part having a similar function throughout the drawings in the structure of the present invention described below, and the description thereof is omitted.

Embodiment 1

In this embodiment, a semiconductor device for realizing reduction in thickness and size and a method for manufacturing the semiconductor device with high yield are described in detail with reference to FIGS. 1A and 1B, FIGS. 2A and 2B, FIGS. 3A to 3F, FIGS. 4A and 4B, FIGS. 5A to 5D, FIGS. 6A to 6C, FIGS. 7A and 7B, and FIGS. 8A and 8B.

Figure 1B:
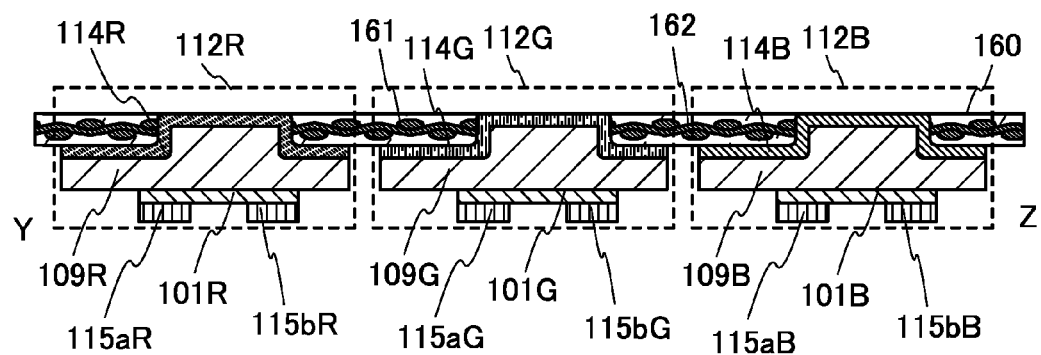

FIGS. 1A and 1B illustrate a semiconductor device of this embodiment. FIG. 1A is a plan view of the semiconductor device, and FIG. 1B is a cross-sectional view along Y-Z in FIG. 1A.

The semiconductor device in FIGS. 1A and 1B has a structure in which a semiconductor integrated circuit 112R, a semiconductor integrated circuit 112G, and a semiconductor integrated circuit 112B are bonded to a structure body 160 in which a fibrous body 161 is impregnated with an organic resin 162. The semiconductor integrated circuit 112R, the semiconductor integrated circuit 112G, and the semiconductor integrated circuit 112B are provided with terminal electrodes 115$a$R and 115$b$R, 115$a$G and 115$b$G, and 115$a$B and 115$b$B which are conductive layers for electrical connection to the outside, respectively.

FIG. 1A illustrates a top view of a woven fabric as the fibrous body 161 which is woven using fiber yarn bundles for warp and weft.

As illustrated in FIG. 1A, the fibrous body 161 is woven using warp yarns spaced at regular intervals and weft yarns spaced at regular intervals. Such a fibrous body which is woven using the warp yarns and the weft yarns has regions without the warp yarns and the weft yarns. In the fibrous body 161, the fibrous body is more easily impregnated with the organic resin 162, whereby adhesiveness between the fibrous body 161 and the semiconductor integrated circuits 112R, 112G, and 112B can be increased.

Further, in the fibrous body 161, density of the warp yarns and the weft yarns may be high and a proportion of the regions without the warp yarns and the weft yarns may be low.

The structure body 160 in which the fibrous body 161 is impregnated with the organic resin 162 is also referred to as a prepreg. A prepreg is formed specifically as follows: after a fibrous body is impregnated with a varnish in which a matrix resin is diluted with an organic solvent, drying is performed so that the organic solvent is volatilized and the matrix resin is semi-cured. The thickness of the structure body 160 is preferably larger than or equal to 10 µm and smaller than or equal to 100 µm, more preferably larger than or equal to 10 µm and smaller than or equal to 30 µm. With the use of the structure body with such a thickness, a semiconductor device which is thin and can be bent can be formed.

Note that in this embodiment, the structure body in which a fibrous body is impregnated with an organic resin may have a layered structure. In that case, the structure body may be a stack of a plurality of structure bodies in each of which a single-layer fibrous body is impregnated with an organic resin or may be a structure body formed in which a plurality of fibrous bodies stacked are impregnated with an organic resin. Further, in stacking a plurality of structure bodies in each of which a single-layer fibrous body is impregnated with an organic resin, another layer may be sandwiched between the structure bodies.

The semiconductor integrated circuits 112R, 112G, and 112B can be mounted on different substrates by using the terminal electrodes.

The semiconductor integrated circuit 112R, the semiconductor integrated circuit 112G, and the semiconductor integrated circuit 112B function as color sensors and include light-transmitting substrates 109R, 109G, and 109B, semiconductor integrated circuit portions 101R, 101G, and 101B which include photoelectric conversion elements, and chromatic color light-transmitting resin layers 114R, 114G, and 114B which function as color filters, respectively. In this embodiment, the semiconductor integrated circuit 112R, the semiconductor integrated circuit 112G, and the semiconductor integrated circuit 112B include a red light-transmitting resin layer 114R, a green light-transmitting resin layer 114G, and a blue light-transmitting resin layer 114B, respectively, and can transmit and detect light of the colors of the light-transmitting resin layers 114R, 114G, and 114B. Therefore, a semiconductor device of this embodiment including the semiconductor integrated circuit 112R, the semiconductor integrated circuit 112G, and the semiconductor integrated circuit 112B can detect light of three colors (red, green, and blue).

Further, the semiconductor integrated circuit 112R, the semiconductor integrated circuit 112G, and the semiconductor integrated circuit 112B have a structure in which at least the chromatic color light-transmitting resin layers 114R, 114G, and 114B cover surfaces of the light-transmitting substrates 109R, 109G, and 109B which are the reverse of surfaces on which the semiconductor integrated circuit portions 101R, 101G, and 101B are formed and part of the end portions (side surfaces) of the light-transmitting substrates 109R, 109G, and 109B, respectively. Thus, the light-transmitting resin layers 114R, 114G, and 114B also function as shock absorbing layers which absorb external stress such as pressure which is applied in the manufacturing step or in the inspection step, so that generation of defects such as a scratch and a crack of the semiconductor integrated circuits 112R, 112G, and 112B can be reduced and thus a semiconductor device with high reliability can be formed.

Chromatic colors are colors except achromatic colors such as black, gray, and white. The coloring layer is formed using a material which transmits only light of a chromatic color with which the material is colored in order to function as the color filter. As a chromatic color, red, green, blue, or the like can be used. Alternatively, cyan, magenta, yellow, or the like may be used.

Figure 2A:
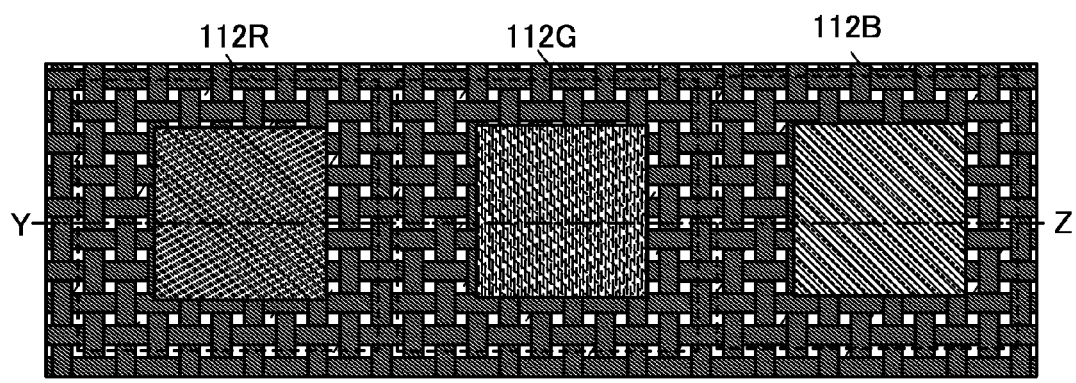
FIGS. 2A and 2B illustrate a semiconductor device according to an embodiment of the present invention.
Figure 2B:
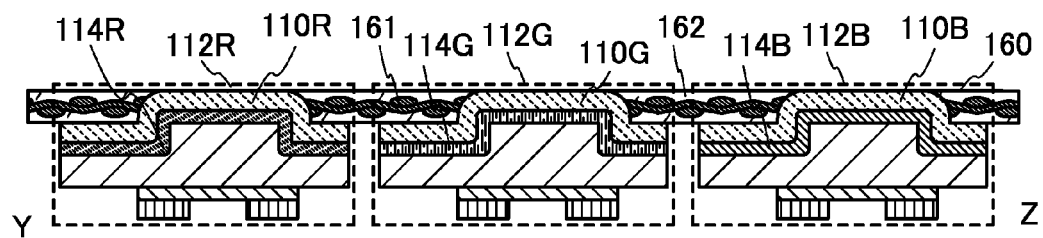

The light-transmitting resin layers 114R, 114G, and 114B are chromatic color coloring layers which function as at least color filters, and a transparent light-transmitting resin layer may be further stacked thereover as a shock absorbing layer. FIGS. 2A and 2B illustrate examples in which light-transmitting resin layers are stacked in the semiconductor device in FIGS. 1A and 1B. FIG. 2A is a plan view of a semiconductor device. FIG. 2B is a cross-sectional view along Y-Z in FIG. 2A.

The semiconductor device of FIGS. 2A and 2B is an example in which the semiconductor integrated circuits 112R, 112G, and 112B in which transparent light-transmitting resin layers 110R, 110G, and 110B are stacked over the chromatic color light-transmitting resin layers 114R, 114G, and 114B, respectively, are bonded to the structure body 160 formed by impregnating the fibrous body 161 with the organic resin 162. The chromatic color light-transmitting resin layers 114R, 114G, and 114B are formed in contact with the light-transmitting substrates. Then, the transparent light-transmitting resin layers 110R, 110G, and 110B are stacked over the chromatic color light-transmitting resin layers 114R, 114G, and 114B, respectively.

The transparent light-transmitting resin layers 110R, 110G, and 110B function as protective layers and have advantages of improving a shock absorption property and in preventing the chromatic color light-transmitting resin layers 114R, 114G, and 114B from deteriorating.

The thickness of each of the light-transmitting resin layers may be larger than or equal to 1 µm and small than or equal to 20 µm. In the case where the light-transmitting resin layers are stacked, the thickness of the transparent light-transmitting resin layers 110R, 110G, and 110B which function as shock absorbing layers may be approximately equal (for example, 1.2 µm in thickness) to or different from that of the light-transmitting resin layers 114R, 114G, and 114B which function as coloring layers.

Alternatively, the thickness of the transparent light-transmitting resin layers 110R, 110G, and 110B which function as shock absorbing layers may be larger than that of the chromatic color light-transmitting resin layers 114R, 114G, and 114B which function as coloring layers. By being formed to be thick, the transparent light-transmitting resin layers 110R, 110G, and 110B which function as shock absorbing layers can have excellent shock absorption properties as the shock absorbing layers. On the other hand, in order that the chromatic color light-transmitting resin layers 114R, 114G, and 114B may function as coloring layers (color filters), the suitable thickness of the chromatic color light-transmitting resin layers 114R, 114G, and 114B is preferably controlled as appropriate in consideration of the relation between the concentration of coloring material to be contained and light transmissivity.

For example, when the thickness of the transparent light-transmitting resin layers 110R, 110G, and 110B which function as shock absorbing layers is larger than that of the light-transmitting resin layers 114R, 114G, and 114B which function as coloring layers, the thickness of the transparent light-transmitting resin layers 110R, 110G, and 110B which function as shock absorbing layers may be larger than or equal to 5 μm and smaller than or equal to 10 μm, and the thickness of the light-transmitting resin layers 114R, 114G, and 114B which function as coloring layers may be larger than or equal to 0.1 μm and smaller than or equal to 1 μm.

The side surfaces of the light-transmitting substrates 109R, 109G, and 109B are provided with steps. As for the width of each of the light-transmitting substrates 109R, 109G, and 109B, the width of the projected section is smaller than that of the other section. Therefore, the cross section of each of the light-transmitting substrates 109R, 109G, and 109B can also be said to have a shape of upside-down T in block letter. The projected section refers to an upper portion of each of the light-transmitting substrate 109R, 109G, and 109B in the case where the surfaces of the light-transmitting substrates 109R, 109G, and 109B, on which the semiconductor integrated circuit portions 101R, 101G, and 101B are formed respectively, face downward.

If the cross section of the light-transmitting substrate is a shape of upside-down T in block letter, the light-transmitting resin layer can be provided so as to fill the cut portion of the end portion of the light-transmitting substrate.

In the semiconductor integrated circuit of this embodiment, the side surface of the light-transmitting substrate in contact with the light-transmitting resin layer may be a curved surface which spreads toward the bottom. The light-transmitting substrate has the curved surface which spreads toward the bottom, whereby the light-transmitting resin layer can be provided so as to cover the curved surface. Further, a bottom surface and a top surface of the light-transmitting substrate are quadrangles, and the area of the bottom surface is larger than that of the top surface. In the case where the area of the bottom surface of the light-transmitting substrate is larger than that of the top surface of the light-transmitting substrate, the light-transmitting resin layer can be formed on the side surface in the region where the bottom surface and the top surface do not overlap with each other, so as to cover the light-transmitting substrate.

According to the present invention, a substrate provided with a plurality of semiconductor integrated circuit portions is divided between the semiconductor integrated circuit portions so that the plurality of semiconductor integrated circuits can be taken out in the chip forms. In the dividing method, first, the substrate is processed to be thin, whereby the time for dividing the substrate is reduced and wear of the process means such as a dicer used for the division is suppressed. Further, the dividing step is not performed at one time. First, a groove for dividing into the semiconductor integrated circuit portions is formed in the light-transmitting substrate, and a stack of the light-transmitting resin layers is formed over the light-transmitting substrate provided with the groove. After that, the light-transmitting resin layers and the light-transmitting substrate are cut along the groove so as to be divided into the plurality of semiconductor integrated circuits.

The cross section of the light-transmitting substrate 109 (109R, 109G, 109B) is a trapezoid with stepped sides, and the thickness of the upper portion of the stepped trapezoid may be equal to or smaller than that of the lower portion of the stepped trapezoid. Further, the thickness of the upper portion of the stepped trapezoid is preferably smaller than that of the structure body in which a fibrous body is impregnated with an organic resin because the light-transmitting substrate 109 does not become higher than the structure body in which a fibrous body is impregnated with an organic resin. Depending on the shape of the groove, the side surface of the upper portion of the stepped trapezoid curves toward the lower portion.

In the cross section of the light-transmitting substrate which is a trapezoid, in the case where the trapezoid curves from the upper portion to the lower portion, coverage of the curved portion with the light-transmitting resin layer is good.

As thus described, the semiconductor integrated circuit of the present invention has a complicated shape, so that top, bottom, right, and left sides of the semiconductor integrated circuit can be easily distinguished. Thus, misidentification even in an automatic operation by a machine can be reduced.

Figure 9:
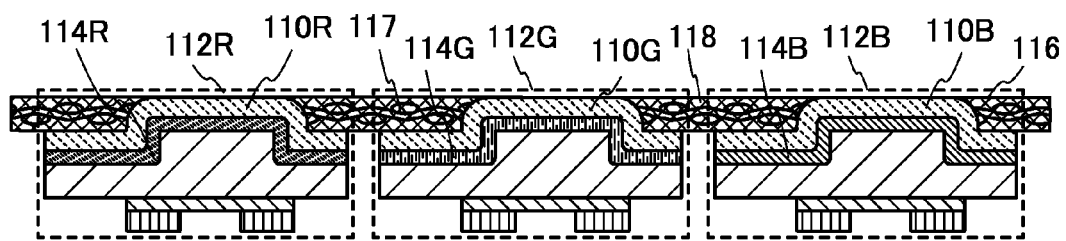
FIG. 9 illustrates a semiconductor device according to an embodiment of the present invention.

Further, when a light-blocking material is used for a structure body 116 in which a fibrous body 117 is impregnated with an organic resin 118 as in FIG. 9, the structure body 116 can be used as a black matrix. In FIG. 9, the semiconductor integrated circuits 112R, 112G, and 112B are bonded to the structure body formed using a light-blocking material, in which a fibrous body is impregnated with an organic resin.

Further, a light-blocking layer which serves as a black matrix may be separately provided over the chromatic color light-transmitting resin layer selectively. The light-blocking layer can be formed by a coating method such as a spin coating method; a droplet discharge method; a printing method; a dipping method; a dispenser method; a brush painting method; a spray method; a flow coating method; or the like. By using a printing method, the light-blocking layer can be selectively formed, so that a process for obtaining a desired shape, such as a photolithography process, can be simplified.

The light-transmitting structure body 116 in which the fibrous body 117 is impregnated with the organic resin 118 is formed to have openings corresponding to the regions where photoelectric conversion elements are provided in the semiconductor integrated circuit portions 101R, 101G, and 101B. The structure body 116 in which the fibrous body 117 is impregnated with the organic resin 118 functions as the black matrix and shields the photoelectric conversion element from external light which is unintentionally delivered, so that malfunction is prevented. Therefore, since the photoelectric conversion element can receive only the light which has passed through the opening of the structure body 116 in which the fibrous body 117 is impregnated with the organic resin 118 and the chromatic color light-transmitting resin layers 114R, 114G, and 114B which function as color filters, reliability of a semiconductor device is improved. When the semiconductor element which is formed in the semiconductor integrated circuit portion is irradiated with light, change of characteristics is possible; however, providing the light-blocking layer can prevent such a defect.

A method for manufacturing a semiconductor device in this embodiment will be described below in detail.

Figure 3A:
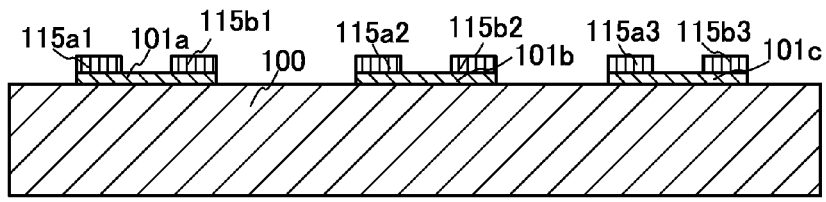
FIGS. 3A to 3F illustrate a method for manufacturing a semiconductor device, according to an embodiment of the present invention.
Figure 3B:
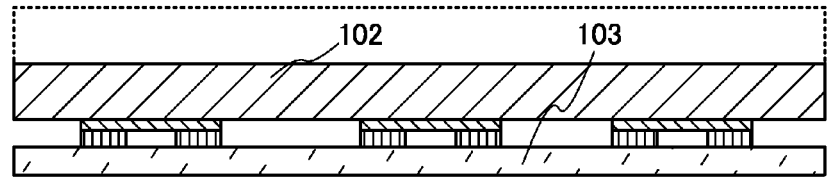

FIG. 3A illustrates semiconductor integrated circuit portions 101a, 101b, and 101c which are provided over a light-transmitting substrate 100 and include the photoelectric conversion elements. The semiconductor integrated circuit portions 101a, 101b, and 101c include terminal electrodes 115a1 and 115b1, 115a2 and 115b2, and 115a3 and 115b3, respectively.

Next, a step of reducing the thickness of the light-transmitting substrate 100 by grinding treatment and/or polishing treatment is performed. The side on which the semiconductor element layers 101a, 101b, and 101c are formed is made to face a fixing tape 103 for fixing the light-transmitting substrate 100 in the step, the light-transmitting substrate 100 is fixed, and the light-transmitting substrate 100 is processed into a light-transmitting substrate 102 which is thin (see FIG. 3B). In the case where the light-transmitting substrate 100 is a glass substrate with a thickness of 0.5 mm, the light-transmitting substrate 102 is preferably thinned to approximately 0.25 to 0.3 mm. By reducing the thickness of the light-transmitting substrate, the process time for dividing the light-transmitting substrate can be reduced, and wear of a processing means such as a dicer used for the division can be reduced. Grinding treatment and polishing treatment can be preferably used in combination. In this embodiment, a substrate is ground by a grinder and after that, a surface of the substrate is planarized with polishing treatment by a polisher. As the polishing treatment, chemical mechanical polishing may be performed.

The plurality of semiconductor integrated circuits having the chip forms are taken out by dividing the light-transmitting substrate. The dividing step is not performed at one time. First, grooves 106a, 106b, 106c, and 106d for dividing between the semiconductor integrated circuit portions 101a, 101b, and 101c and bonding them to the structure body in which a fibrous body is impregnated with an organic resin are formed in the light-transmitting substrate 102 by a dicing blade of a dicer 104 (see FIG. 3C). Below the grooves 106a, 106b, 106c, and 106d in a light-transmitting substrate 105, the light-transmitting substrate 105 is intentionally left.

Since the grooves 106a, 106b, 106c, and 106d serve as attachment regions (bonding regions) of the structure body in which a fibrous body is impregnated with an organic resin in a later step, the depth of the grooves 106a, 106b, 106c, and 106d is preferably smaller (shallower) than the thickness of the structure body in which a fibrous body is impregnated with an organic resin. In the case where the depth of the grooves 106a, 106b, 106c, and 106d is smaller (shallower) than the thickness of the structure body in which a fibrous body is impregnated with an organic resin, when the structure body in which a fibrous body is impregnated with an organic resin is bonded by pressure bonding, a pressure is easily applied. Therefore, the depth of the grooves 106a, 106b, 106c, and 106d may be approximately larger than or equal to 10 μm and smaller than or equal to 100 μm (is preferably approximately larger than or equal to 10 μm and smaller than or equal to 30 μm).

Figure 3C:
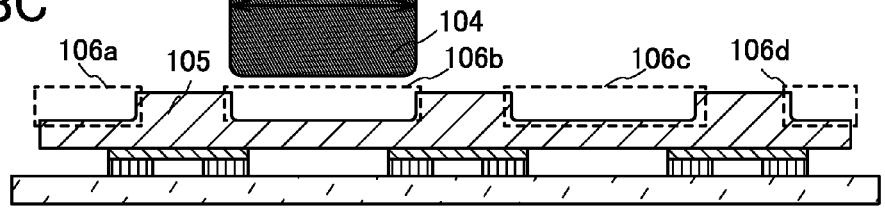

Although FIG. 3C illustrates an example in which a groove is formed at one time by the dicer 104 having the width $a_1$, a groove may be formed by grinding the light-transmitting substrate 102 a plurality of times by a dicer having a smaller width.

Figure 3D:
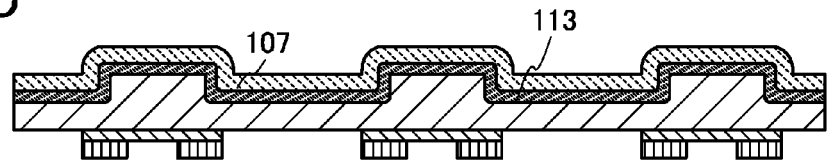
Figure 3E:
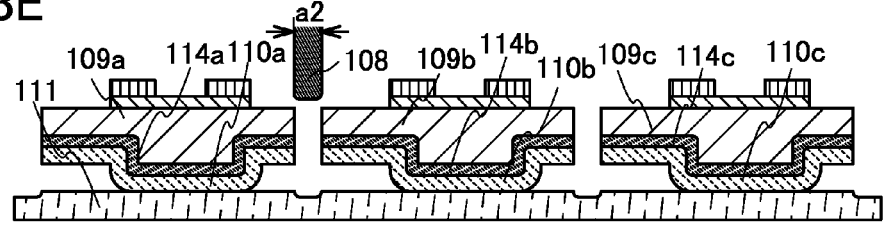

Next, a stack of a light-transmitting resin layer 113 and a light-transmitting resin layer 107 is formed over the light-transmitting substrate 102 in which the grooves 106a, 106b, 106c, and 106d are formed (see FIG. 3D). As a material of the light-transmitting resin layers 113 and 107, a resin material which can withstand heat temperature is used in the case where heat treatment is used in a step after the light-transmitting resin layer is formed (for example, at the time of being bonded to the structure body in which a fibrous body is impregnated with an organic resin or being mounted on another substrate). One of the stacked light-transmitting resin layers is a chromatic color coloring layer which functions as a color filter, and the other is a resin layer which functions as a shock absorbing layer. In this embodiment, the light-transmitting resin layer 113 including a chromatic color coloring material is formed.

Forming the light-transmitting resin layer 107 which functions as a shock absorbing layer can give higher stress resistance to a semiconductor integrated circuit and a semiconductor device. For example, even when a pressure of approximately 20 N is applied, a semiconductor integrated circuit provided with the light-transmitting resin layer according to an embodiment of the present invention can withstand the pressure without being damaged.

For the light-transmitting resin layer, a resin material such as a vinyl resin, an epoxy resin, a phenol resin, a novolac resin, an acrylic resin, a melamine resin, an urethane resin, or a siloxane resin can be used. As a method for forming the resin layer, an coating method such as a spin coating method can be used. Alternatively, a droplet discharge method, a printing method, a dipping method, a dispenser method, a brush coating method, a spraying method, a flow coating method, or the like can be used.

After that, the light-transmitting resin layers 113 and 107 and the light-transmitting substrate 105 are cut along the grooves 106a, 106b, 106c, and 106d so as to be divided into the plurality of semiconductor integrated circuits. In this embodiment, the light-transmitting substrate 105 and the light-transmitting resin layers 113 and 107 are fixed to a fixing tape 111, and the light-transmitting substrate 105 and the light-transmitting resin layers 113 and 107 which are left in the grooves 106a, 106b, 106c, and 106d are cut from the light-transmitting substrate 105 side by a dicer 108 having the width $a_2$. By the dicer 108, the light-transmitting substrate 105 and the light-transmitting resin layers 113 and 107 are divided to form light-transmitting substrates 109a, 109b, and 109c, and light-transmitting resin layers 114a, 114b, 114c, 110a, 110b, and 110c (see FIG. 3E). In this embodiment, a dicing tape is used as the fixing tapes 103 and 111.

When the light-transmitting substrate 105 in which the grooves are formed and the light-transmitting resin layers 113 and 107 are cut, they can be cut from the light-transmitting substrate 105 side or the light-transmitting resin layers 113 and 107 side. An alignment marker may be formed on the light-transmitting substrate 105.

Figure 3F:
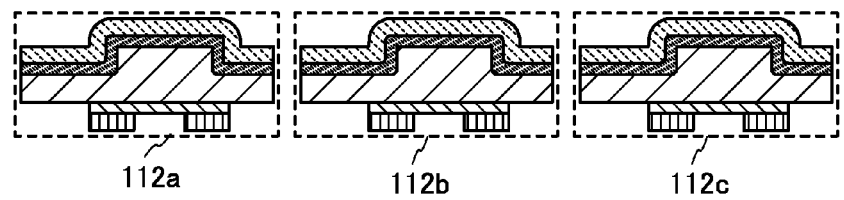

Through the above steps, semiconductor integrated circuits 112a, 112b, and 112c can be formed (see FIG. 3F). The width of a cut surface where the light-transmitting resin layers 113 and 107 and the light-transmitting substrate 105 are cut is made smaller than the width of the groove, whereby the resin layer formed in the groove can be left on side surfaces of the light-transmitting substrate. In this embodiment, the width of the dicer 104 and the width of the dicer 108 each correspond to the thickness of a dicing blade by which a smallest process region (a region to be processed by the dicer) is determined.

The width of the groove can be controlled by the width $a_1$ of the dicing blade of the dicer 104, and the width of the cut surface can be controlled by the width $a_2$ of the dicing blade of the dicer 108. Accordingly, the width $a_2$ of the dicing blade of the dicer 108 may be made smaller than the width $a_1$ of the dicing blade of the dicer 104.

Accordingly, in the semiconductor integrated circuits 112a, 112b, and 112c, surfaces where the semiconductor integrated circuit portions 101a, 101b, and 101c are not provided and part of side surfaces are covered with the light-transmitting resin layers 114a, 114b, 114c, 110a, 110b, and 110c.

The shape of the groove formed in the light-transmitting substrate depends on a processing means. In this embodiment, since the shape of the dicing blade of the dicer 104 is slightly rounded, the grooves 106a, 106b, 106c, and 106d also have rounded shapes (shapes with curvature) in the cross section in FIG. 1B. When the shape of the dicing blade is rectangular, the shape of the groove is also rectangular, whereby an end portion of the light-transmitting substrate in the semiconductor integrated circuit after the division can also have a rectangular shape.

Further, since the thickness of the substrate is larger than that of the light-transmitting resin layer, the thickness of the light-transmitting resin layer is also preferably large in order that coverage of end portions of the substrate may be improved. By being formed to have a layered structure as in FIG. 2B, the light-transmitting resin layer can be formed to be thick. The shape of a semiconductor integrated circuit to be completed can be freely changed depending on the structure, the thickness, or the cut position of the light-transmitting resin layer.

Dividing with a dicer with a thin dicing blade may leave a large groove region of the light-transmitting substrate in the completed semiconductor integrated circuit. The structure body in which a fibrous body is impregnated with an organic resin is bonded to the groove region; therefore, as the groove region is larger, bonding strength is further increased. Stacking a light-transmitting resin layer functioning as a shock absorbing material can give higher stress resistance to the semiconductor integrated circuit.

Further, in the present invention, a groove is formed and a light-transmitting resin layer is formed thereover, so that the light-transmitting resin layer can be formed to be thick on a bottom surface of the groove. Further, after the light-transmitting resin layer is formed, the stack of the light-transmitting resin layer and the light-transmitting substrate is cut; therefore, the end portions of the light-transmitting resin layer are aligned with those of the light-transmitting substrate in the side surfaces. The upper end portions of the light-transmitting substrate are not exposed in the side surfaces; therefore, the end portions of the light transmitting substrate can be prevented from being damaged or getting chipped. Further, in the case where the light-transmitting resin layer is formed to have a layered structure so as to be thick, the distance between the end portion of the light-transmitting substrate and the end portion of the light-transmitting resin layer can be long in the side surface of the semiconductor integrated circuit. Therefore, a damage to the end portion of the light-transmitting substrate can be suppressed.

As illustrated in FIGS. 3A to 3F, a plurality of semiconductor integrated circuits formed on substrates and obtained by division are bonded to the structure body in which a fibrous body is impregnated with an organic resin, so that a semiconductor device including the plurality of semiconductor integrated circuits is manufactured.

Figure 4A:
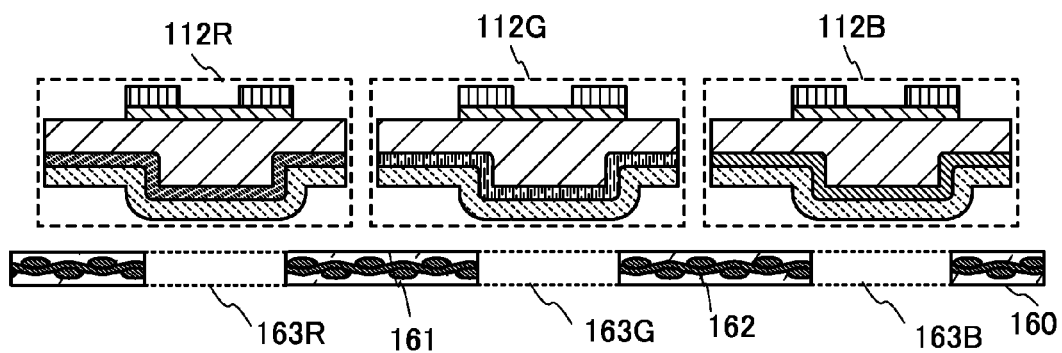
FIGS. 4A and 4B illustrate a method for manufacturing a semiconductor device, according to an embodiment of the present invention.

In FIG. 4A, the semiconductor integrated circuits 112R, 112G, and 112B are formed on substrates as in FIGS. 3A to 3F.

The semiconductor integrated circuit 112R, the semiconductor integrated circuit 112G, and the semiconductor integrated circuit 112B function as color sensors and include light-transmitting substrates 109R, 109G, and 109B, semiconductor integrated circuit portions 101R, 101G, and 101B which include photoelectric conversion elements, and chromatic color light-transmitting resin layers 114R, 114G, and 114B which function as color filters, respectively. In this embodiment, the semiconductor integrated circuit 112R, the semiconductor integrated circuit 112G, and the semiconductor integrated circuit 112B include a red light-transmitting resin layer 114R, a green light-transmitting resin layer 114G, and a blue light-transmitting resin layer 114B, respectively, and can transmit and detect light of the colors of the light-transmitting resin layers 114R, 114G, and 114B.

In the semiconductor integrated circuit 112R, the semiconductor integrated circuit 112G, and the semiconductor integrated circuit 112B, conductive layers are provided for the terminal electrodes 115aR, 115bR, 115aG, 115bG, 115aB, and 115bB for electrical connection at the time of mounting on surfaces of the semiconductor integrated circuits.

The terminal electrodes 115aR, 115bR, 115aG, 115bG, 115aB, and 115bB may be formed using conductive resins by a wet process or may be formed using conductive thin films by a dry process. Alternatively, a conductive resin layer and a conductive thin film may be stacked.

For example, in the case of forming the conductive layer by a screen printing method, the conductive layer can be formed by selectively printing a conductive paste in which conductive particles each having a particle size of several nanometers to several tens micrometers are dissolved or dispersed in an organic resin. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like or fine particles of silver halide can be used. Further, as the organic resin contained in the conductive paste, one or more selected from organic resins functioning as a binder of metal particles, a solvent, a dispersing agent, and a coating material can be used. Typically, an organic resin such as an epoxy resin and a silicone resin can be given. Further, in forming the conductive layer, it is preferable to bake the conductive paste after being provided. Alternatively, fine particles containing solder or lead-free solder may be used.

Figure 4B:
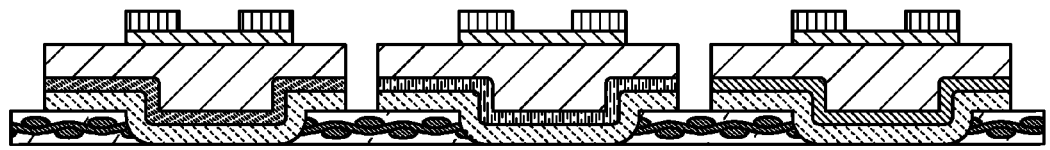

The semiconductor integrated circuit 112R, the semiconductor integrated circuit 112G, and the semiconductor integrated circuit 112B are bonded to the structure body 160 in which the fibrous body 161 is impregnated with the organic resin 162, which has openings 163R, 163G, and 163B (see FIG. 4B).

Further, before the semiconductor integrated circuits are bonded to the structure body in which a fibrous body is impregnated with an organic resin, an inspection step may be performed on the semiconductor integrated circuits. A semiconductor device can be formed by bonding a conforming product selected through the inspection step to the structure body in which a fibrous body is impregnated with an organic resin.

The structural body is heated and subjected to pressure bonding so that the organic resin of the structure body is plasticized or cured. Note that in the case where the organic resin is an organic plastic resin, the organic resin which has been plasticized is cured by being cooled to a room temperature. By heating and pressure bonding, the organic resin is uniformly spread so as to be in close contact with a semiconductor integrated circuit and is cured. A step in which the structure body is subjected to pressure bonding is performed under an atmospheric pressure or a reduced pressure. The organic resin may be a photocurable resin and is irradiated with light to be bonded to the structure body after being in close contact with the semiconductor integrated circuit.

A thermosetting resin such as an epoxy resin, an unsaturated polyester resin, a polyimide resin, a bismaleimide-triazine resin, or a cyanate resin can be used as the organic resin 162. Alternatively, a thermoplastic resin such as a polyphenylene oxide resin, a polyetherimide resin, or a fluorine resin can be used as the organic resin 162. Still alternatively, a plurality of resins selected from the above thermosetting resins and thermoplastic resins may be used as the organic resin 162. By using the above organic resin, the fibrous body can be bonded to the semiconductor integrated circuits 112R, 112G, and 112B by heat treatment or light irradiation treatment. The higher the glass transition temperature of the organic resin 162 is, the less easily the organic resin 162 is damaged by local pressure, which is preferable.

Highly thermally-conductive filler may be dispersed in the organic resin 162 or yarn bundles of fibers. As the highly thermally-conductive filler, aluminum nitride, boron nitride, silicon nitride, alumina, or the like can be given. As the highly thermally-conductive filler, a metal particle such as silver or copper can also be given. In the case where the highly thermally-conductive filler is included in the organic resin or the yarn bundles of fibers, heat generated in the semiconductor integrated circuits 112R, 112G, and 112B can be easily released to the outside. Accordingly, thermal storage in the semiconductor device can be suppressed and thus the semiconductor device can be prevented from being damaged.

The fibrous body 161 is a woven or nonwoven fabric using high-strength fibers of an organic compound or an inorganic compound and provided so as to overlap part of the semiconductor integrated circuits 112R, 112G, and 112B. The high-strength fiber is specifically a fiber with a high modulus of elasticity in tension or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, and a carbon fiber can be given. As a glass fiber, a glass fiber using E glass, S glass, D glass, Q glass, or the like can be given. Note that the fibrous body 161 may be formed from one kind of the above high-strength fibers or a plurality of the above high-strength fibers.

The fibrous body 161 may be a woven fabric which is woven using bundles of fibers (single yarns) (hereinafter the bundles of fibers are referred to as yarn bundles) for warp yarns and weft yarns, or a nonwoven fabric obtained by stacking yarn bundles of plural kinds of fibers randomly or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which is subjected to fabric opening has a large width, has a smaller number of single yarns in the thickness direction, and has an elliptical shape or a flat shape in cross section. Further, by using a loosely twisted yarn for the yarn bundle of fibers, the yarn bundle is easily flattened and has an elliptical shape or a flat shape in cross section. Using a yarn bundle having an elliptical shape or a flat shape in cross section in this manner can reduce the thickness of the fibrous body 161. Accordingly, the thickness of the structure body 160 can be reduced and thus a thin semiconductor device can be manufactured.

Note that in drawings of this embodiment, the fibrous body 161 is illustrated as a woven fabric which is plain-woven using a yarn bundle having an elliptical shape in cross section.

Further, in order to enhance permeability of an organic resin into the inside of the yarn bundle of fibers, the fiber may be subjected to surface treatment. For example, as the surface treatment, corona discharge treatment, plasma discharge treatment, or the like for activating a surface of the fiber can be given. Further, surface treatment using a silane coupling agent or a titanate coupling agent can be given.

The semiconductor device including a plurality of semiconductor integrated circuits can be mounted on a different substrate with solder or an anisotropic conductive layer.

Further, as for the structure of a connecting portion of the semiconductor device and an electrode of the different substrate on which the semiconductor device is mounted, a wiring over the substrate may be brought into contact with a bump which is a conductive projection provided on a terminal electrode of the semiconductor integrated circuit and the different substrate on which the semiconductor device is mounted and the semiconductor integrated circuit may be bonded with a resin. Alternatively, by providing a resin in which conductive particles are dispersed, between the electrode of the different substrate on which the semiconductor integrated circuit is mounted and the terminal electrode of the semiconductor integrated circuit, the electrode of the different substrate on which the semiconductor integrated circuit is mounted and the terminal electrode of the semiconductor integrated circuit may be connected and bonded to be fixed with an organic resin in which conductive particles are dispersed. Further, as the resin used for bonding, a photocurable resin, a thermosetting resin, a resin which is naturally cured, or the like can be used.

Note that it is preferable to provide a resin to bond the semiconductor device and the different substrate on which the semiconductor device is mounted because bond strength is increased.

Further, as described in this embodiment, since in the semiconductor integrated circuit, a light-transmitting resin layer is not exposed to the semiconductor integrated circuit portion side, the semiconductor integrated circuit has high heat resistance. Therefore, defects due to heat treatment in mounting the semiconductor integrated circuit on the different substrate with a solder or an anisotropic conductive layer can be prevented from being generated.

Being covered with the light-transmitting resin layer, a thin light-transmitting substrate formed in the semiconductor integrated circuit is easily handled in the process and is not easily damaged for example. Therefore, a semiconductor integrated circuit and a semiconductor device with higher performance and smaller thickness can be manufactured with high yield.

Since the plurality of semiconductor integrated circuits which are mounted on the structure body in which a fibrous body is impregnated with an organic resin can be freely selected, the semiconductor integrated circuits including chromatic color light-transmitting resins of different colors so that a semiconductor device including semiconductor integrated circuits of a plurality of colors, each of which has a function of a color sensor, can be manufactured.

Further, a semiconductor integrated circuit can be subjected to an inspection step before being bonded to a structure body in which a fibrous body is impregnated with an organic resin, so that only a conforming product can be selected and bonded to the structure body in which a fibrous body is impregnated with an organic resin. Thus, yield of a semiconductor device is increased in a manufacturing process. Particularly in the case of a structure in which the semiconductor integrated circuit includes a semiconductor integrated circuit portion including a complicated structure such as an amplifier circuit, since there is a possibility that defects are generated in the semiconductor integrated circuit having a chip form, it is effective that the semiconductor integrated circuit can be inspected for defects before being bonded to the structure body in which a fibrous body is impregnated with an organic resin.

Further, a semiconductor integrated circuit of the present invention has a structure in which at least a chromatic color light-transmitting resin covers a surface of a light-transmitting substrate, which is the reverse of the surface on which a semiconductor integrated circuit portion is formed and a part of an end portion (side surface) of the light-transmitting substrate. Thus, the light-transmitting resin layer also functions as a shock absorbing layer which absorbs external stress such as pressure which is applied in the manufacturing step or in the inspection step, so that defects such as a scratch and a crack of a semiconductor integrated circuit can be reduced, and a semiconductor device with high reliability can be manufactured.

Figure 5A:
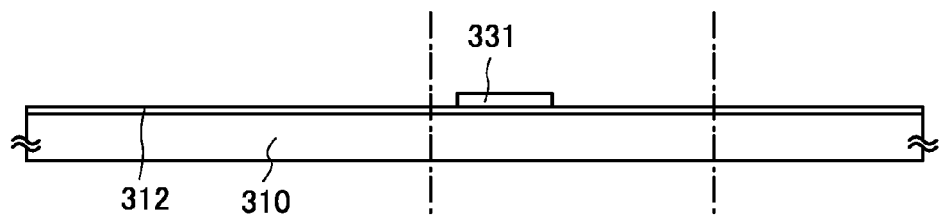
FIGS. 5A to 5D illustrate a method for manufacturing a semiconductor device, according to an embodiment of the present invention.

A method for forming a photoelectric conversion element and a field effect transistor over a substrate for a semiconductor integrated circuit portion obtained by division is described with reference to cross-sectional views in FIGS. 5A to 5D, FIGS. 6A to 6C, and FIGS. 7A and 7B. In FIG. 7A, AN 100 which is one of glass substrates is used as the light-transmitting substrate 310. A thin film transistor is used as a field effect transistor formed over the substrate so that a photoelectric conversion element and a thin film transistor can be formed over the substrate in the same process; therefore, there is an advantage that mass production of semiconductor integrated circuits is easy. Note that in an embodiment of the present invention, the photoelectric conversion element is irradiated with light transmitted through the light-transmitting resin layer which functions as a color filter and the light-transmitting substrate.

First, a silicon oxide film containing nitrogen (with a thickness of 100 nm) to be the base insulating film 312 is formed by a plasma CVD method, and a semiconductor film such as an amorphous silicon film containing hydrogen (with a thickness of 54 nm) is stacked over the base insulating film 312 without being exposed to the atmosphere. The base insulating film 312 may be formed by stacking a silicon oxide film, a silicon nitride film, and a silicon oxide film containing nitrogen. For example, the base insulating film 312 may be formed by stacking a silicon nitride film containing oxygen with a thickness of 50 nm and a silicon oxide film containing nitrogen with a thickness of 100 nm. Note that the silicon oxide film containing nitrogen or the silicon nitride film functions as a blocking layer which prevents diffusion of impurities such as alkali metal from a glass substrate.

The semiconductor layer included in a semiconductor element can be formed using the following material: an amorphous semiconductor manufactured by or a sputtering method or a vapor-phase growth method using a semiconductor material gas typified by silane or germane; a polycrystalline semiconductor formed by crystallizing the amorphous semiconductor with the use of light energy or thermal energy; a microcrystalline (also referred to as semiamorphous or microcrystal) semiconductor; or the like. The semiconductor layer can be formed by a sputtering method, an LPCVD method, a plasma CVD method, or the like.

The microcrystalline semiconductor film belongs to a metastable state which is intermediate between an amorphous state and a single crystal state when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a lower wavenumber than 520 cm$^{-1}$ which represents a peak of the Raman spectrum of single crystal silicon. That is to say, a peak of a Raman spectrum of microcrystalline silicon lies between 520 cm$^{-1}$ and 480 cm$^{-1}$ which represent that of single crystal silicon and that of amorphous silicon, respectively. The microcrystalline semiconductor film contains hydrogen or halogen of at least 1 at. % to terminate dangling bonds. Further, a rare gas element such as helium, argon, krypton, or neon may be contained to further promote lattice distortion, so that stability is enhanced and a favorable microcrystalline semiconductor film can be obtained.

The microcrystalline semiconductor film can be formed by a high-frequency plasma CVD method with a frequency of several tens of MHz to several hundred MHz or a microwave plasma CVD apparatus with a frequency of 1 GHz or more. The microcrystalline semiconductor film can be typically formed using silicon hydride such as $SiH_4$, $Si_2H_6$, $SiH_2Cl_2$, $SiHCl_3$, $SiCl_4$, or $SiF_4$ which is diluted with hydrogen. Alternatively, with a dilution with one or plural kinds of rare gas elements selected from helium, argon, krypton, and neon in addition to silicon hydride and hydrogen, the microcrystalline semiconductor film can be formed. In that case, the flow ratio of hydrogen to silicon hydride is set to be 5:1 to 200:1, preferably, 50:1 to 150:1, more preferably, 100:1.

Hydrogenated amorphous silicon may be typically used as an amorphous semiconductor, while polysilicon and the like may be typically used as a crystalline semiconductor. As examples of polysilicon (polycrystalline silicon), so-called high-temperature polysilicon which contains polysilicon as a main component and is formed at a process temperature of 800° C. or more, so-called low-temperature polysilicon that contains polysilicon as a main component and is formed at a process temperature of 600° C. or less, polysilicon obtained by crystallizing amorphous silicon by using an element promoting crystallization or the like, and the like are given. It is needles to say that as mentioned above, a microcrystalline semiconductor or a semiconductor containing a crystal phase in part of a semiconductor layer may be used.

As a material of the semiconductor, as well as an element of silicon (Si), germanium (Ge), or the like, a compound semiconductor such as GaAs, InP, SiC, ZnSe, GaN, or SiGe can be used. Alternatively, ZnO, SnO, or the like which is an oxide semiconductor may be used. In the case of using ZnO for a semiconductor layer, a gate insulating layer is preferably formed using yttrium oxide, aluminum oxide, titanium oxide, or a stack of any of the above. For a gate electrode layer, a source electrode layer, and a drain electrode layer, ITO, gold, titanium, or the like is preferably used. Alternatively, ZnO to which indium, gallium, or the like is added may be used.

In the case of using a crystalline semiconductor film for the semiconductor layer, the crystalline semiconductor film may be formed by any of various methods (such as a laser crystallization method, a thermal crystallization method, and a thermal crystallization method using an element promoting crystallization, such as nickel). Further, a microcrystalline semiconductor may be crystallized by laser irradiation to enhance crystallinity. In the case where the element promoting crystallization is not introduced, hydrogen is released from an amorphous silicon film by heat treatment before irradiating the amorphous silicon film with a laser beam. For example, hydrogen is released until the concentration of hydrogen contained in the amorphous silicon film becomes $1 \times 10^{20}$ atoms/cm$^3$ or less by heating the amorphous silicon film at a temperature of 500° C. for one hour in a nitrogen atmosphere. This is because the amorphous silicon film containing a high amount of hydrogen is destroyed when being irradiated with a laser beam.

A method for introducing the element promoting crystallization into the amorphous semiconductor layer is not particularly limited as long as it is capable of introducing the element promoting crystallization to a surface of or inside the amorphous semiconductor film. For example, a sputtering method, a CVD method, a plasma treatment method (including a plasma CVD method), an adsorption method, or a method for applying a solution of metal salt can be used. Among them, a method of using a solution is simple and advantageous in that the concentration of the element promoting crystallization can be easily controlled. At this time, it is desirable to form an oxide film by ultraviolet irradiation in an oxygen atmosphere, a thermal oxidation method, treatment with either ozone water containing hydroxyl radicals or hydrogen peroxide, or the like to improve wettability of the surface of the amorphous semiconductor film so that an aqueous solution is diffused on the entire surface of the amorphous semiconductor film.

In a crystallization step in which an amorphous semiconductor film is crystallized to form a crystalline semiconductor film, an element promoting crystallization may be added to the amorphous semiconductor film and crystallization may be performed by heat treatment (at 550 to 750° C. for 3 minutes to 24 hours). The element promoting crystallization can be one or more of metal elements such as iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element promoting crystallization from the crystalline semiconductor film, a semiconductor film containing an impurity element is formed in contact with the crystalline semiconductor film and is made to function as a gettering sink. As the impurity element, an impurity element imparting n-type conductivity, an impurity element imparting p-type conductivity, a rare gas element, or the like can be used; for example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor film containing a rare gas element is formed in contact with the crystalline semiconductor film containing the element promoting crystallization, and heat treatment (at 550 to 750° C. for 3 minutes to 24 hours) is performed. The element promoting crystallization, which is contained in the crystalline semiconductor film, moves into the semiconductor film containing a rare gas element and thus, the element promoting crystallization, which is contained in the crystalline semiconductor film, is removed or reduced. After that, the semiconductor film containing a rare gas element, which has served as a gettering sink, is removed.

An amorphous semiconductor film may be crystallized by the combination of heat treatment and laser beam irradiation, or one of heat treatment and laser beam irradiation may be performed a plurality of times.

A crystalline semiconductor film may be formed on a substrate directly by a plasma method. Alternatively, the crystalline semiconductor film may be selectively formed over a substrate by a plasma method.

In this embodiment, a polycrystalline silicon film is obtained by a crystallization method using a catalytic element as a semiconductor film. A nickel acetate solution containing nickel of 10 ppm by weight is added by a spinner. Note that a nickel element may be dispersed over the entire surface by a sputtering method instead of a method of adding the solution. Then, heat treatment is performed for crystallization to form a semiconductor film (here, a polycrystalline silicon film) having a crystalline structure. Here, a polycrystalline silicon film is obtained by heat treatment for crystallization (at 550° C. for four hours) after the heat treatment (at 500° C. for one hour).

Next, an oxide film over the surface of the polycrystalline silicon film is removed by a dilute hydrofluoric acid or the like. After that, in order to increase a crystallization rate and repair defects left in crystal grains, irradiation with a laser beam (XeCl: wavelength of 308 nm) is performed in the atmosphere or an oxygen atmosphere.

As the laser beam, an excimer laser beam with a wavelength of 400 nm or less; or a second harmonic or a third harmonic of a YAG laser is used. Here, the surface of the silicon film may be scanned as follows: a pulsed laser beam with a repetition rate of approximately 10 to 1000 Hz is used, the pulsed laser beam is condensed to 100 to 500 mJ/cm$^2$ by an optical system, and irradiation is performed with an overlap rate of 90 to 95%. In this embodiment, irradiation with a laser beam with a repetition rate of 30 Hz and energy density of 470 mJ/cm$^2$ is performed in the atmosphere.

Note that since laser beam irradiation is performed in the atmosphere or in an oxygen atmosphere, an oxide film is formed over the surface by the laser beam irradiation. Note that although an example in which the pulsed laser is used is described in this embodiment, a continuous wave laser may alternatively be used. In order to obtain a crystal with a large grain size at the time of crystallization of a semiconductor film, it is preferable to use a solid laser which is capable of continuous oscillation and to apply the second to fourth harmonic of a fundamental wave. Typically, a second harmonic (532 nm) or a third harmonic (355 nm) of an Nd:YVO$_4$ laser (a fundamental wave of 1064 nm) may be applied.

In the case of using a continuous wave laser, a laser beam which is emitted from a continuous wave YVO$_4$ laser of which output is 10 W is converted into a harmonic by a non-linear optical element. Alternatively, there is a method by which YVO$_4$ crystal and a non-linear optical element are put in a resonator and a high harmonic is emitted. Then, the laser beam having a rectangular shape or an elliptical shape on an irradiated surface is preferably formed by an optical system to be emitted to an object to be processed. At this time, a power density of approximately 0.01 to 100 MW/cm$^2$ (preferably, 0.1 to 10 MW/cm$^2$) is necessary. Then, the semiconductor film may be moved at a rate of approximately 10 to 2000 cm/s relatively to the laser beam so as to be irradiated.

Subsequently, in addition to the oxide film which is formed by the laser beam irradiation, a barrier layer formed of an oxide film having a thickness of 1 to 5 nm in total is formed by treatment of the surface with ozone water for 120 seconds. The barrier layer is formed in order to remove the element which is added for crystallization, for example, nickel (Ni), from the film. Although the barrier layer is formed using ozone water here, the barrier layer may be formed by depositing an oxide film having a thickness of approximately 1 to 10 nm by a method of oxidizing a surface of the semiconductor film having a crystalline structure by ultraviolet irradiation in an oxygen atmosphere; a method of oxidizing a surface of the semiconductor film having a crystalline structure by oxygen plasma treatment; a plasma CVD method; a sputtering method; an evaporation method; or the like. Note that the oxide film formed by the laser beam irradiation may be removed before formation of the barrier layer.

Then, an amorphous silicon film containing an argon element, which serves as a gettering site, is formed to a thickness of 10 to 400 nm, here 100 nm, over the barrier layer by a sputtering method. Here, the amorphous silicon film containing an argon element is formed under an atmosphere containing argon with the use of a silicon target. In the case where the amorphous silicon film containing an argon element is formed by a plasma CVD method, deposition conditions are as follows: a flow ratio of monosilane to argon (SiH$_4$:Ar) is 1:99, deposition pressure is set to 6.665 Pa, RF power density is set to 0.087 W/cm$^2$, and deposition temperature is set to 350° C.

After that, heat treatment in a furnace heated at 650° C. is performed for 3 minutes to remove the catalytic element (gettering). Accordingly, the concentration of the catalytic element in the semiconductor film having a crystalline structure is reduced. A lamp annealing apparatus may be used instead of the furnace.

Next, the amorphous silicon film containing an argon element, which is a gettering site, is selectively removed using the barrier layer as an etching stopper, and subsequently, the barrier layer is selectively removed with a diluted hydrofluoric acid. Note that nickel is likely to move to a region having high oxygen concentration at the time of gettering; therefore, it is preferable that the barrier layer formed of an oxide film be removed after gettering.

In the case where crystallization of the semiconductor film with the use of an element promoting crystallization is not performed, the above steps such as the step of forming the barrier layer, the step of forming the gettering site, the step of performing heat treatment for gettering, the step of removing the gettering site, and the step of removing the barrier layer are not necessary.

Next, a thin oxide film is formed on the surface of the obtained semiconductor film having a crystalline structure (for example, a crystalline silicon film) with ozone water, and subsequently, a mask is formed of a resist using a first photomask and the semiconductor film is etched to have a desired shape, so that an island-shaped semiconductor layer 331 is formed (see FIG. 5A). After the island-shaped semiconductor layer 331 is formed, a mask formed of a resist is removed.

Next, a very small amount of an impurity element (boron or phosphorus) is added in order to control a threshold voltage of a transistor, if necessary. Here, an ion doping method is used, in which diborane ($B_2H_6$) is not separated by mass but excited by plasma.

Next, the oxide film is removed with an etchant containing a hydrofluoric acid, and at the same time, the surface of the semiconductor layer 331 is washed. After that, an insulating film to be a gate insulating film 313 is formed.

The gate insulating film 313 may be formed using silicon oxide or may be formed to have a layered structure of silicon oxide and silicon nitride. The gate insulating film 313 may be formed by depositing an insulating film by a plasma CVD method or a low pressure CVD method or may be formed by solid phase oxidation or solid phase nitridation by plasma treatment. This is because a gate insulating film which is formed using a semiconductor layer which is oxidized or nitrided by plasma treatment is dense, has high withstand voltage, and is excellent in reliability. For example, a surface of the semiconductor layer is oxidized or nitrided using nitrous oxide ($N_2O$) diluted with Ar by 1 to 3 times (flow ratio) by application of a microwave (2.45 GHz) power of 3 to 5 kW at a pressure of 10 to 30 Pa. By this treatment, an insulating film with a thickness of 1 to 10 nm (preferably, 2 to 6 nm) is formed. Further, nitrous oxide ($N_2O$) and silane ($SiH_4$) are introduced and electric power of microwaves (2.45 GHz) of 3 to 5 kW is applied to the insulating film at a pressure of 10 to 30 Pa to form a silicon oxynitride film by a vapor-phase growth method, which is to be a gate insulating film. With a combination of a solid-phase reaction and a reaction by a vapor-phase growth method, the gate insulating film with low interface state density and an excellent withstand voltage can be formed.

As the gate insulating film 313, a high dielectric constant material such as zirconium dioxide, hafnium oxide, titanium dioxide, or tantalum pentoxide may be used. By using a high dielectric constant material for the gate insulating film 313, a gate leakage current can be reduced.

In this embodiment, as the gate insulating film 313, a silicon oxide film containing nitrogen is formed to a thickness of 115 nm by a plasma CVD method.

Figure 5B:
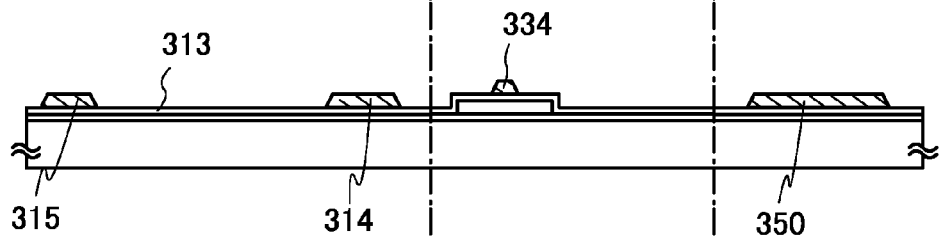
Figure 6A:
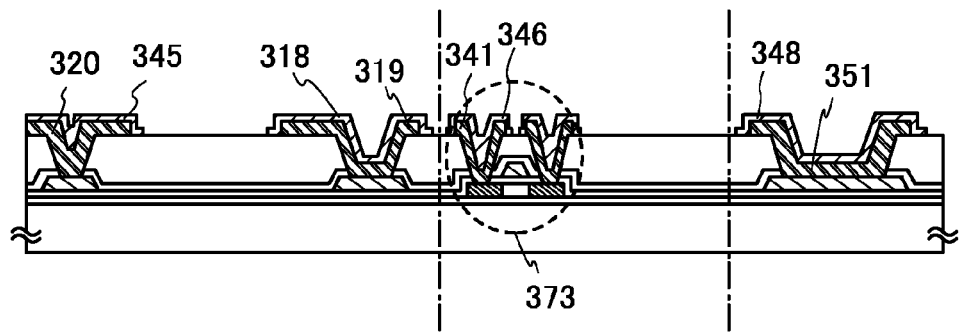
FIGS. 6A to 6C illustrate a method for manufacturing a semiconductor device, according to an embodiment of the present invention.

Next, after a metal film is formed over the gate insulating film 313, a gate electrode 334, wirings 314 and 315, and a terminal electrode 350 are formed using a second photomask (see FIG. 5B). As the metal film, for example, a film is used, in which tantalum nitride and tungsten (W) are stacked to be 30 nm and 370 nm, respectively.

Note that, as the gate electrode 334, the wirings 314 and 315, and the terminal electrode 350, instead of the above film, a single-layer film formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), and copper (Cu), or an alloy material or a compound material containing any of the above elements as its main component; a single-layer film formed using nitride thereof, for example, titanium nitride, tungsten nitride, tantalum nitride or molybdenum nitride may be used.

Note that, as the gate electrodes 334, the wirings 314 and 315, and the terminal electrode 350, a light-transmitting material which transmits visible light may be used. As a light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), ZnO doped with gallium (Ga), tin oxide ($SnO2$), indium oxide containing tungsten oxide, indium zinc oxide containing tungsten oxide, indium oxide containing titanium oxide, indium tin oxide containing titanium oxide, or the like may be used.

Figure 5C:
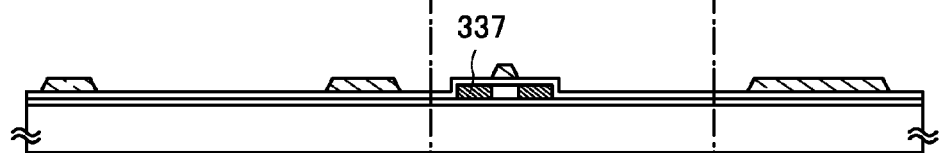

Next, an impurity imparting one conductivity type is introduced into the semiconductor layer 331 to form a source and drain regions 337 of a transistor 373 (see FIG. 5C). In this embodiment, an n-channel transistor is formed; therefore, an impurity imparting n-type conductivity, for example, phosphorus (P) or arsenic (As) is introduced into the semiconductor layer 331. In the case where a p-channel transistor is formed, an impurity imparting p-type conductivity, for example, boron (B) may be introduced into the semiconductor layer 331.

Next, a first interlayer insulating film (not shown) including a silicon oxide film is formed to a thickness of 50 nm by a CVD method, and after that, a step of activating the impurity element added to the semiconductor layer 331 is performed. This activation process is performed by a rapid thermal annealing method (RTA method) using a lamp light source; an irradiation method with a YAG laser or an excimer laser from the back side; heat treatment using a furnace; or a method which is a combination of any of the above methods.

Then, a second interlayer insulating film 316 including a silicon nitride film containing hydrogen and oxygen is formed, for example, to a thickness of 10 nm.

Figure 5D:
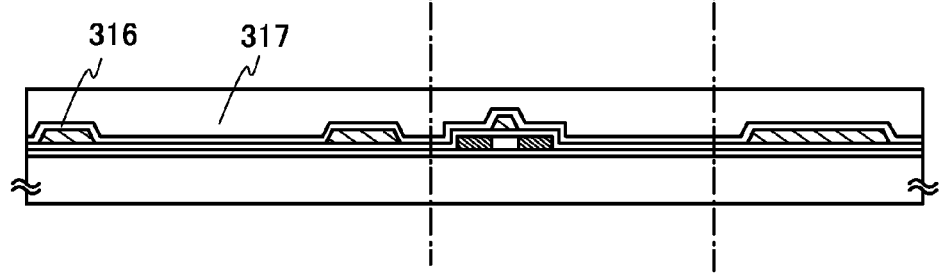

Next, a third interlayer insulating film 317 formed using an insulating material is formed over the second interlayer insulating film 316 (see FIG. 5D). An insulating film obtained by a CVD method can be used as the third interlayer insulating film 317. In this embodiment, in order to improve adhesion, a silicon oxide film containing nitrogen is formed to a thickness of 900 nm as the third interlayer insulating film 317.

Then, heat treatment (heat treatment at 300 to 550° C. for 1 to 12 hours, for example, at 410° C. for an hour in a nitrogen atmosphere) is performed to hydrogenate the island-shaped semiconductor layer. This step is performed to terminate a dangling bond of the semiconductor layer by hydrogen contained in the second interlayer insulating film 316. The semiconductor layer can be hydrogenated regardless of whether or not the gate insulating film 313 is formed.

Note that as the third interlayer insulating film 317, an insulating film using siloxane or a layered structure thereof may be used. Siloxane is composed of a skeleton structure of a bond of silicon (Si) and oxygen (O). A compound containing at least hydrogen (such as an alkyl group or an aryl group) is used as a substituent. Fluorine may be contained in the compound.

In the case where an insulating film using siloxane or a layered structure thereof is used as the third interlayer insulating film 317, after formation of the second interlayer insulating film 316, heat treatment to hydrogenate the semiconductor layer may be performed, and then, the third interlayer insulating film 317 may be formed.

Next, a mask is formed of a resist by using a third photomask, and the first interlayer insulating film, the second interlayer insulating film 316, the third interlayer insulating film 317, or the gate insulating film 313 are selectively etched to form a contact hole. Then, the mask formed of a resist is removed.

Note that the third interlayer insulating film 317 may be formed if necessary. In the case where the third interlayer insulating film 317 is not formed, the first interlayer insulating film, the second interlayer insulating film 316, and the gate insulating film 313 are selectively etched after formation of the second interlayer insulating film 316 to form a contact hole.

Next, after formation of a metal layered film by a sputtering method, a mask is formed of a resist by using a fourth photomask, and then, the metal film is selectively etched to form a wiring 319, a connection electrode 320, a terminal electrode 351, a source and drain electrodes 341 of the transistor 373. Then, the mask formed of a resist is removed. Note that the metal film of this embodiment is a layered film in which a Ti film with a thickness of 100 nm, an Al film containing a very small amount of Si with a thickness of 350 nm, and a Ti film with a thickness of 100 nm are stacked.

In the case where each of the wiring 319, the connection electrode 320, the terminal electrode 351, and the source and drain electrodes 341 of the transistor 373 is formed using a single-layer conductive film, a titanium film (Ti film) is preferable in terms of heat resistance, conductivity, and the like. Instead of a titanium film, a single-layer film formed using an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing any of the above elements as its main component; a single-layer film formed using nitride thereof, for example, titanium nitride, tungsten nitride, tantalum nitride, or molybdenum nitride may be used. The number of times of deposition can be reduced in the manufacturing process by forming each of the wiring 319, the connection electrode 320, the terminal electrode 351, and the source and drain electrodes 341 of the transistor 373 as a single-layer film.

The top gate transistor 373 using a polycrystalline silicon film as the semiconductor layer can be manufactured through the process described above.

Although an n-channel transistor is used as a semiconductor element included in the semiconductor integrated circuit portion in this embodiment, a p-channel transistor may alternatively be used. Any of a variety of types of field effect transistors can be employed, and there is no limitation on an applicable type of the transistor.

Although a transistor having a single-gate structure is described in this embodiment, a transistor having a multi-gate structure such as a double-gate structure may alternatively be employed. In this case, gate electrode layers may be provided above and below the semiconductor layer or a plurality of gate electrode layers may be provided only on one side of (above or below) the semiconductor layer.

Alternatively, a transistor or the like formed by using an inkjet method or a printing method may be used. Accordingly, transistors can be formed at room temperature, can be formed at a low vacuum, or can be formed using a large substrate. Further, since the transistor can be formed without using a mask (reticle), a layout of the transistor can be changed easily. Further, since it is not necessary to use a resist, the material cost is reduced and the number of steps can be reduced. Further, since a film is formed only at a necessary portion, a material is not wasted compared with a manufacturing method in which etching is performed after a film is formed over the entire surface, so that the cost can be reduced.

Alternatively, a transistor or the like including an organic semiconductor or a carbon nanotube may be used. Such a transistor can be formed over a substrate which can be bent. Therefore, such a transistor can resist a shock.

Alternatively, a transistor may be formed using a light-transmitting SOI substrate, or the like using a single crystal semiconductor layer as a semiconductor layer. Thus, transistors can be formed with almost no variations in characteristics, sizes, shapes, or the like, with high current supply capability, and with small sizes. By using such a transistor, power consumption of a circuit can be reduced or high integration of a circuit can be achieved.

By forming a field effect transistor using a thin film transistor, the semiconductor device of this embodiment can be formed over a light-transmitting substrate such as a glass substrate. Therefore, even in the case where the photoelectric conversion element is formed over a substrate, the photoelectric conversion element can receive light transmitted through the substrate from a back surface thereof.

Subsequently, a conductive metal film (titanium (Ti), molybdenum (Mo), or the like) which is not likely to react with a photoelectric conversion layer (typically, amorphous silicon) formed later and thus does not easily become an alloy is formed. Then, a mask formed of a resist is formed using the fifth photomask, and a protective electrode 318 which covers the wiring 319, a protective electrode 345, a protective electrode 346, and a protective electrode 348 are formed by selectively etching the conductive metal film (FIG. 6A). Here, a Ti film having a thickness of 200 nm obtained by a sputtering method is used. Note that the connection electrode 320, the terminal electrode 351, and the source and drain electrodes 341 of the transistor 373 are also covered with the conductive metal film. Thus, the conductive metal film also covers a side surface of the substrate where the Al film which is the second layer in these electrodes is exposed; therefore, the conductive metal film can also prevent diffusion of aluminum atoms to the photoelectric conversion layer.

Note that in the case where each of the wiring 319, the connection electrode 320, the terminal electrode 351, and the source and drain electrodes 341 of the transistor 373 are formed using a single-layer conductive film, the protective electrodes 318, 345, 346, and 348 are not necessarily formed.

Next, a photoelectric conversion layer 371 including a p-type semiconductor layer 371p, an i-type semiconductor layer 371i, and an n-type semiconductor layer 371n is formed over the third interlayer insulating film 317.

The p-type semiconductor layer 371p may be formed by depositing a semi-amorphous silicon film (also referred to as a microcrystalline silicon film) containing an impurity element belonging to Group 13 of the periodic table, such as boron (B), by a plasma CVD method.

As one example of a method for forming a microcrystalline silicon film, a microcrystalline silicon film is formed by glow discharge plasma in the mixed gas of a silane gas and hydrogen, or a silane gas, hydrogen, and a rare gas. Silane is diluted with hydrogen, a rare gas, or hydrogen and a rare gas by 10 to 2000 times. Therefore, a large amount of hydrogen, a rare gas, or hydrogen and a rare gas is required. A temperature for heating the substrate is 100 to 300° C., preferably 120 to 220° C. It is preferable that deposition be performed at a temperature of 120 to 220° C. in order that a growing surface of the microcrystalline silicon film may be inactivated with hydrogen and growth of microcrystalline silicon may be promoted. In the deposition treatment, crystals of a SiH radical, a $SiH_2$ radical, and a $SiH_3$ radical which are active species are grown from the crystal nuclei. Further, an energy band width may be adjusted by mixing germanium hydride or germanium fluoride such as $GeH_4$ or $GeF_4$ into a gas such as silane or adding carbon or germanium to silicon. In the case where carbon is added to silicon, an energy band width is increased, and in the case where germanium is added to silicon, an energy band width is reduced.

Further, the wiring 319 and the protective electrode 318 are in contact with the bottom layer of the photoelectric conversion layer 371, in this embodiment, the p-type semiconductor layer 371p.

After the p-type semiconductor layer 371p is formed, the i-type semiconductor layer 371i and the n-type semiconductor layer 371n are sequentially formed. Accordingly, the photoelectric conversion layer 371 including the p-type semiconductor layer 371p, the i-type semiconductor layer 371i, and the n-type semiconductor layer 371n is formed.

As the i-type semiconductor layer 371i, for example, a microcrystalline silicon film may be formed by a plasma CVD method. Note that as the n-type semiconductor layer 371n, a microcrystalline silicon film containing an impurity element belonging to Group 15 of the periodic table, for example, phosphorus (P) may be formed, or after formation of a microcrystalline silicon film, an impurity element belonging to Group 15 of the periodic table may be introduced.

As the p-type semiconductor layer 371p, the i-type semiconductor layer 371i, and the n-type semiconductor layer 371n, an amorphous semiconductor film may be used instead of a microcrystalline semiconductor film. Alternatively, a polycrystalline semiconductor film formed using the above catalyst or the above laser crystallization process may be used.

Alternatively, single crystal silicon formed by Smart Cut (registered trademark) method may be used.

Figure 6B:
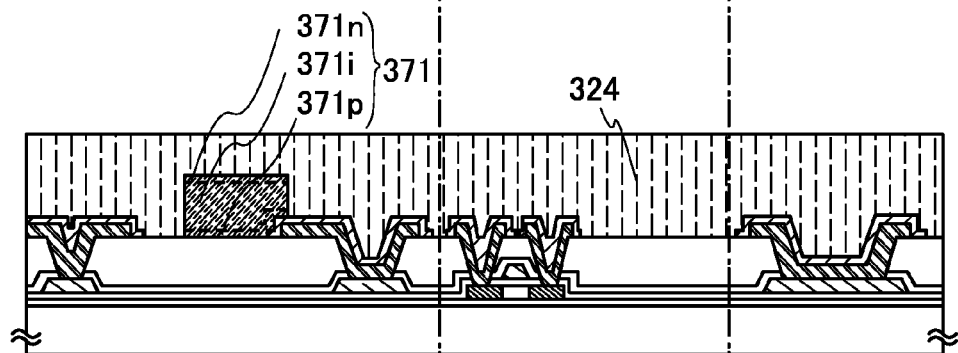
Figure 6C:
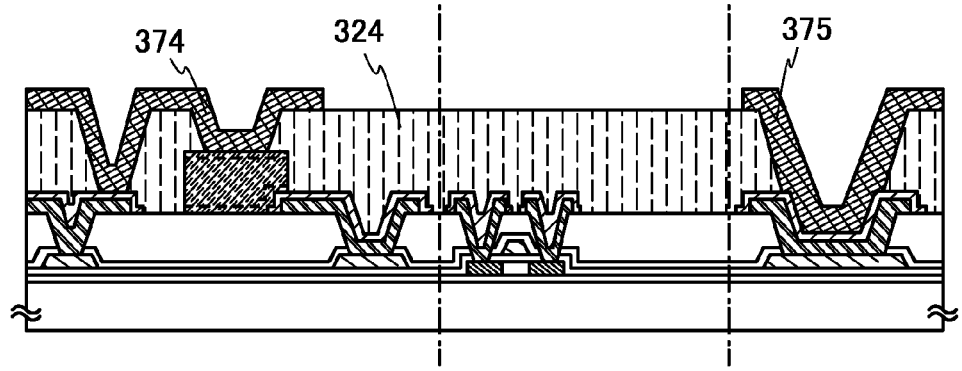
Figure 7A:
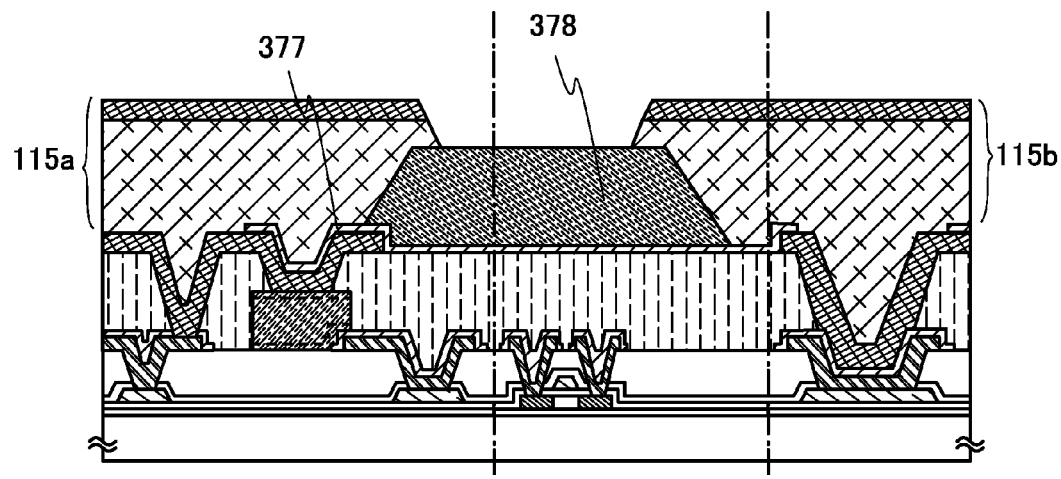
FIGS. 7A and 7B illustrate a method for manufacturing a semiconductor device, according to an embodiment of the present invention.

Next, a sealing layer 324 is formed using an insulating material (for example, an inorganic insulating film containing silicon) to a thickness of 1 to 30 μm over the entire surface to obtain a state shown in FIG. 6B. Here, as an insulating material film, a silicon oxide film containing nitrogen with a thickness of 1 μm is formed by a CVD method. By using an insulating film formed by a CVD method, improvement in adhesion can be achieved.

Next, after the sealing layer 324 is etched to form openings, wirings 374 and 375 are formed by a sputtering method. The wirings 374 and 375 are titanium films (Ti films) (200 nm) which are obtained by a sputtering method.

Next, a protective film 377 is formed to cover an exposed surface. As the protective film 377, a silicon nitride film is used in this embodiment. The protective film 377 makes it possible to prevent impurities such as moisture and an organic substance from entering the transistor 373 and the photoelectric conversion layer 371.

Next, a sealing film 378 is formed over the protective film 377. The sealing film 378 also functions of protecting a semiconductor integrated circuit portion from external stress. In this embodiment, the sealing film 378 is formed to a thickness of 20 μm with a photosensitive epoxy-phenol-based resin. Ohmcoat 1012B (manufactured by Namics Corporation) which is a photosensitive epoxy-phenol-based resin may be used for the sealing film 378.

Next, part of the protective film in a region where the terminal electrode in an upper layer is electrically connected to the wiring 374 or the wiring 375 in a lower layer is etched to form a contact hole.

Next, a stack of a titanium film (Ti film) (150 nm), a nickel film (Ni film) (750 nm), and a gold film (Au film) (50 nm) are formed over the sealing film 378 using nickel (Ni) paste by a sputtering method, for example. The adhesive strength of the terminal electrodes 115a and 115b thus obtained exceeds 5 N, which is sufficient as adhesive strength of a terminal electrode.

Figure 7B:
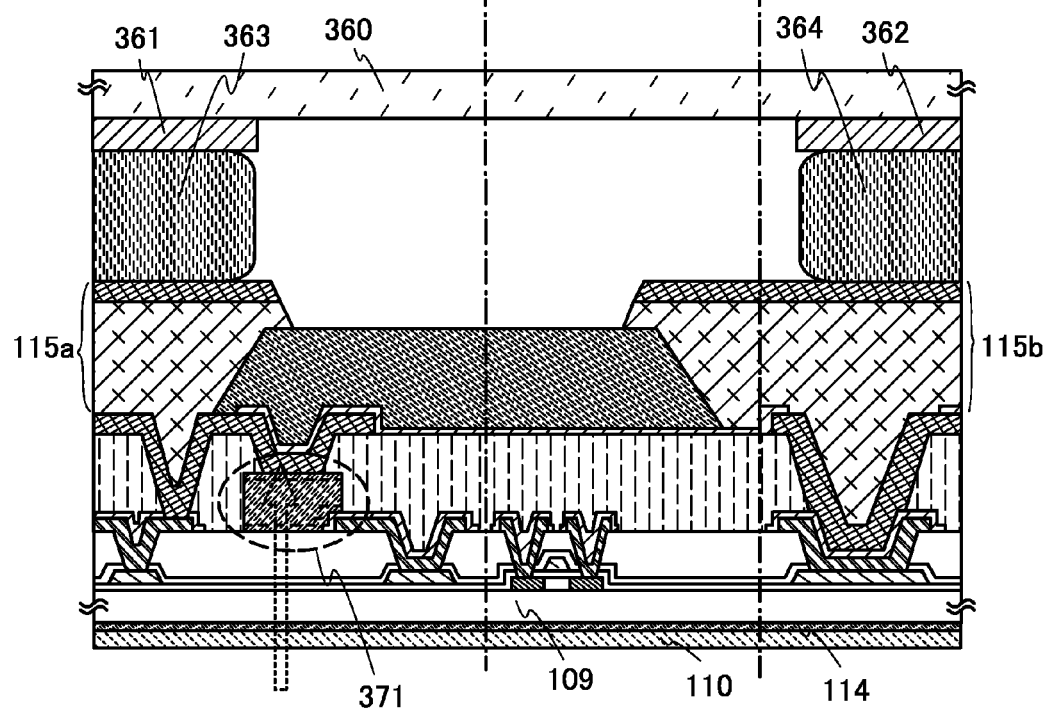

Through the steps described above, the terminal electrodes 115a and 115b which can be connected by a solder are formed, and a structure illustrated in FIG. 7B can be obtained.

In practice, mass production of semiconductor integrated circuit portions each of which includes a photoelectric conversion element, a transistor, and the like, and which are formed at the time of FIG. 7B is possible by formation of element materials over a large substrate. A large number of semiconductor integrated circuits (for example, 2 mm×1.5 mm) including semiconductor integrated circuit portions can be manufactured from one large substrate (for example, 600 cm×720 cm). The state is illustrated in FIGS. 8A and 8B.

Figure 8A:
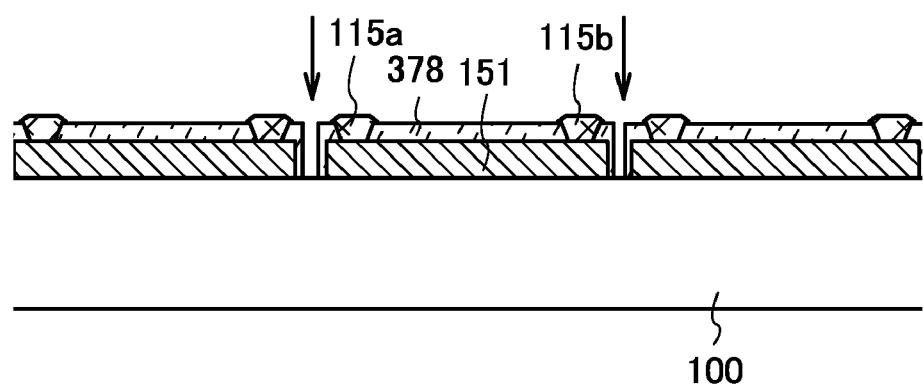
FIGS. 8A and 8B illustrate a method for manufacturing a semiconductor device, according to an embodiment of the present invention.
Figure 8B:
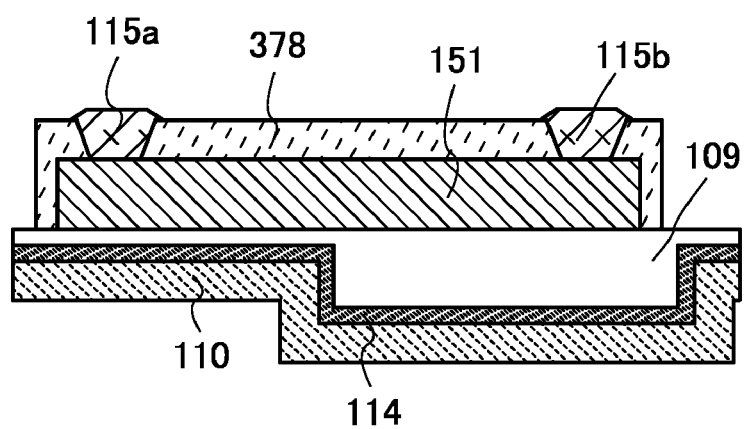

In FIG. 8A, an element layer 151, the sealing film 378, and the terminal electrodes 115a and 115b are formed over a light-transmitting substrate 100. The element layer 151 includes all structures formed between the light-transmitting substrate 100 and the sealing film 378 in FIG. 7A.

The light-transmitting substrate 100 is divided between the element layers 151 which are adjacent to each other, so that a light-transmitting substrate 109 having an element is formed.

A plurality of semiconductor integrated circuits including semiconductor integrated circuit portions, which are thus formed, are bonded to a structure body in which a fibrous body is impregnated with an organic resin, so that a semiconductor device is manufactured.

Further, the semiconductor device can be mounted on a mounted substrate 360 by solders 363 and 364 (see FIG. 7B). Note that the terminal electrode 115a is mounted on an electrode 361 on the mounted substrate 360 by the solder 363, and the terminal electrode 115b is mounted on an electrode 362 by the solder 364. FIG. 7B illustrates one of the plurality of semiconductor integrated circuits bonded to a structure body in which a fibrous body is impregnated with an organic resin.

In the photoelectric conversion element illustrated in FIG. 7B, light which enters the photoelectric conversion layer 371 can be transmitted from the light-transmitting substrate 109 and the light-transmitting resin layers 110 and 114 side by using the light-transmitting substrate 109 and the light-transmitting resin layers 110 and 114.

According to an embodiment of the present invention, a semiconductor device may be provided in a housing which has an opening in an incident region where light is delivered to a photoelectric conversion element or which has a light-transmitting region formed using a light-transmitting material. Since the photoelectric conversion element is made to detect light transmitted through the chromatic color light-transmitting resin layer, light from the external which is transmitted through a region where the chromatic color light-transmitting resin layer is formed and enters the photoelectric conversion element can be blocked by covering with a housing, the region where the chromatic color light-transmitting resin layer is formed. Therefore, accuracy of the semiconductor device as a sensor is improved, and discrepancy can be reduced.

The semiconductor device is manufactured through the manufacturing process described above, and thus the semiconductor device can be manufactured at low unit cost and with high yield.

Before dividing the light-transmitting substrate, the thickness of the light-transmitting substrate is reduced, and the division is performed in two steps, so that wear of a cutting tool when a light-transmitting substrate is processed and divided can be reduced. Since the region which is processed by the cutting tool is increased as the size of the light-transmitting substrate is increased and as the size of each of semiconductor integrated circuits which are obtained by division is reduced, the cutting tool further wears out. Therefore, an embodiment of the present invention by which wearing out of the cutting tool can be reduced is particularly beneficial to a large substrate and a smaller semiconductor integrated circuit. Therefore, a semiconductor integrated circuit and a semiconductor device can be manufactured at low cost. The thickness of a semiconductor integrated circuit and a semiconductor device can be reduced because thickness of the light-transmitting substrate is small.

Therefore, a highly reliable semiconductor device which is easily treated though it is thin can be provided.

Embodiment 2

For a semiconductor device according to an embodiment of the present invention, any of a variety of forms of field effect transistors can be used as a semiconductor element included in a semiconductor integrated circuit portion. In this embodiment, a field effect transistor including a single crystal semiconductor layer is described in detail as a semiconductor element.

A method in which a single crystal semiconductor layer made from a single crystal semiconductor substrate is provided over a light-transmitting substrate and a semiconductor element included in a semiconductor integrated circuit portion is formed is described below with reference to FIGS. 15A to 15D and FIGS. 16A to 16C.

Figure 15A:
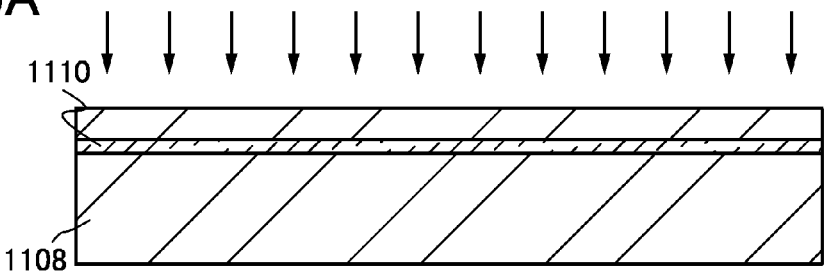
FIGS. 15A to 15D illustrate a method for manufacturing a semiconductor device, according to an embodiment of the present invention.

A single crystal semiconductor substrate 1108 illustrated in FIG. 15A is cleaned, and is irradiated with ions accelerated by an electric field to a predetermined depth from the surface to form an embrittlement layer 1110. Ion irradiation is performed in consideration of the thickness of a single crystal semiconductor layer which is to be transferred to a light-transmitting substrate. An accelerating voltage in irradiation of the ions is set in consideration of such a thickness, and the single crystal semiconductor substrate 1108 is irradiated with the ions. In the present invention, a region which is embrittled by irradiating a single crystal semiconductor substrate with ions so that the region includes microvoids due to the ions is referred to as an embrittlement layer.

As the single crystal semiconductor substrate 1108, a commercial single crystal semiconductor substrate can be used. For example, a single crystal semiconductor substrate formed using a Group 4 element, such as a single crystal silicon substrate, a single crystal germanium substrate, or a single crystal silicon germanium substrate can be used. Alternatively, a compound semiconductor substrate formed using gallium arsenide, indium phosphide, or the like may be used. As the semiconductor substrate, a polycrystalline semiconductor substrate may be used. It is needless to say that the single crystal semiconductor substrate is not limited to a circular wafer, and single crystal semiconductor substrates with a variety of shapes can be used. For example, a polygonal substrate such as a rectangular substrate, a pentagonal substrate, or a hexagonal substrate can be used. It is also needless to say that a commercial circular single crystal semiconductor wafer can be used for the single crystal semiconductor substrate. As the circular single crystal semiconductor wafer, a semiconductor wafer of silicon, germanium, or the like; a compound semiconductor wafer of gallium arsenide, indium phosphide, or the like; or the like can be used. Typical examples of the single crystal semiconductor wafer are circular single crystal silicon wafers which are 5 inches (125 mm) in diameter, 6 inches (150 mm) in diameter, 8 inches (200 mm) in diameter, 12 inches (300 mm) in diameter, 400 mm in diameter, and 450 mm in diameter. Further, a rectangular single crystal semiconductor substrate can be formed by cutting a commercial circular single crystal semiconductor wafer. The substrate can be cut with a cutting device such as a dicer or a wire saw, laser cutting, plasma cutting, electron beam cutting, or any other appropriate cutting means. Alternatively, a rectangular single crystal semiconductor substrate can be formed in such a way that an ingot for manufacturing a semiconductor substrate before being sliced into a substrate is processed into a rectangular solid so as to have a rectangular cross section and the rectangular solid ingot is sliced. Note that although there is no particular limitation on the thickness of the single crystal semiconductor substrate, a thick single crystal semiconductor substrate is preferable in consideration of reuse of the single crystal semiconductor substrate because many single crystal semiconductor layers can be formed from one piece of thick material wafer. The thickness of single crystal silicon wafers circulating in the market conforms to SEMI standards, which specify that, for example, a wafer with a diameter of 6 inches has a thickness of 625 µm, a wafer with a diameter of 8 inches has a thickness of 725 µm, and a wafer with a diameter of 12 inches has a thickness of 775 µm. Note that the thickness of a wafer conforming to SEMI standards includes a tolerance of ±25 µm. It is needless to say that the thickness of the single crystal semiconductor substrate to be a material is not limited to those of SEMI standards, and the thickness can be adjusted as appropriate when an ingot is sliced. It is also needless to say that when the single crystal semiconductor substrate 1108 is reused, the thickness of the reused single crystal semiconductor substrate 1108 is smaller than the thickness specified by the SEMI standards. A single crystal semiconductor layer obtained over a light-transmitting substrate can be determined by selecting a semiconductor substrate to serve as a base.

Further, the crystal plane orientation of the single crystal semiconductor substrate 1108 may be selected depending on a semiconductor element to be manufactured (a field effect transistor in this embodiment). For example, a single crystal semiconductor substrate having a {100} plane, a {110} plane, or the like can be used.

In this embodiment, an ion irradiation separation method is used in which hydrogen, helium, or fluorine ions are added by irradiation to a predetermined depth of the single crystal semiconductor substrate, and then, heat treatment is performed to separate a single crystal semiconductor layer, which is an outer layer. Alternatively, a method may be employed in which single crystal silicon is epitaxially grown on porous silicon and the porous silicon layer is separated by cleavage with water jetting.

A single crystal silicon substrate is used as the single crystal semiconductor substrate 1108, and the surface thereof is processed with dilute hydrofluoric acid. Accordingly, a native oxide film is removed and contaminant such as dust which is attached to the surface is also removed, whereby the surface of the single crystal semiconductor substrate 1108 is cleaned.

The embrittlement layer 1110 may be formed by irradiating the substrate with ions by an ion doping method (abbreviated as an ID method) or an ion implantation method (abbreviated as an II method). The embrittlement layer 1110 is formed by irradiating the substrate with ions of hydrogen, helium, or a halogen typified by fluorine. In the case of irradiation of fluorine ions as a halogen element, $BF_3$ may be used as a source gas. Note that ion implantation is a method in which an ionized gas is mass-separated and a semiconductor substrate is irradiated with the ions.

For example, an ionized hydrogen gas is mass-separated by an ion implantation method and only $H^+$ ions (or only $H_2^+$ ions) can be selectively accelerated and a single crystal semiconductor substrate can be irradiated with the ions.

In an ion doping method, without mass separation of an ionized gas, plural kinds of ion species are generated in plasma and accelerated, and then a single crystal semiconductor substrate is irradiated with the accelerated ion species. For example, when the single crystal semiconductor substrate is irradiated with hydrogen ions including $H^+$ ions, $H_2^+$ ions, and $H_3^+$ ions, the proportion of $H_3$ ions is typically 50% or more, for example, in general, the proportion of $H_3^+$ ions is 80% and the proportion of other ions ($H_2^+$ ions and $H^+$ ions) is 20%. Here, ion doping also refers to irradiation of only $H_3^+$ ions as ion species.

Alternatively, irradiation may be performed with one ion or plural ions formed of the same atoms which have different mass. For example, in the case of irradiation of hydrogen ions, the hydrogen ions preferably include $H^+$ ions, $H_2^+$ ions, and $H_3^+$ ions with a high proportion of $H_3^+$ ions. In the case of hydrogen ion irradiation, when the hydrogen ions include $H^+$ ions, $H_2^+$ ions, and $H_3^+$ ions with a high proportion of $H_3^+$ ions, efficiency in irradiation can be increased and irradiation time can be reduced. With this structure, separation can be performed easily.

An ion doping method and an ion implantation method are described below in detail. In an ion doping apparatus (also referred to as an ID apparatus) used in an ion doping method, a plasma space is large, so that the single crystal semiconductor substrate can be irradiated with a large amount of ions. On the other hand, an ion implantation apparatus (also referred to as an II apparatus) used in an ion implantation method has a characteristic that mass separation is performed on ions extracted from plasma and only specific ion species can be introduced into a semiconductor substrate. In the ion implantation method, processing is usually performed by scanning a point beam.

As for a plasma generation method, both of the apparatuses create a plasma state by thermoelectrons which are emitted by heating a filament, for example. However, an ion doping method and an ion implantation method differ greatly in the proportion of the hydrogen ion species when the semiconductor substrate is irradiated with hydrogen ions ($H^+$, $H_2^+$, and $H_3^+$) which are generated.

In view of irradiation of a larger amount of $H_3^+$, the ion doping apparatus is preferable to the ion implantation apparatus.

When the single crystal silicon substrate is irradiated with hydrogen ions or halogen ions such as fluorine ions, fluorine which is added knocks out (expels) silicon atoms in a silicon crystal lattice, so that blank portions are created effectively and microvoids are made in the embrittlement layer. In this case, the volume of the microvoids formed in the embrittlement layer is changed by heat treatment at relatively low temperature and separation is performed along the embrittlement layer, so that a thin single crystal semiconductor layer can be formed. After the irradiation of fluorine ions, irradiation of hydrogen ions may be performed so that hydrogen is contained in the voids. Since the embrittlement layer which is formed to separate the thin single crystal semiconductor layer from the single crystal semiconductor substrate is separated using change in volume of the microvoids formed in the embrittlement layer, it is preferable to make effective use of action of fluorine ions or hydrogen ions in such a manner.

A protective layer may be formed between the single crystal semiconductor substrate and an insulating layer which is to be bonded to the single crystal semiconductor layer. The protective layer can be formed of a single layer selected from a silicon nitride layer, a silicon oxide layer, a silicon nitride oxide layer, or a silicon oxynitride layer or a stack of a plurality of layers. These layers can be formed over the single crystal semiconductor substrate before the embrittlement layer is formed in the single crystal semiconductor substrate. Alternatively, these layers may be formed over the single crystal semiconductor substrate after the embrittlement layer is formed in the single crystal semiconductor substrate.

Note that a silicon oxynitride layer refers to a layer that contains more oxygen than nitrogen and, in the case where measurements are performed using Rutherford backscattering spectrometry (RBS) and hydrogen forward scattering (HFS), contains oxygen, nitrogen, silicon, and hydrogen at concentrations of 50 to 70 at. %, 0.5 to 15 at. %, 25 to 35 at. %, and 0.1 to 10 at. %, respectively. Further, a silicon nitride oxide layer refers to a layer that contains more nitrogen than oxygen and, in the case where measurements are performed using RBS and HFS, contains oxygen, nitrogen, silicon, and hydrogen at concentrations of 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

It is necessary to perform irradiation of ions under high dose conditions in the formation of the embrittlement layer, and the surface of the single crystal semiconductor substrate 1108 is roughened in some cases. Accordingly, a protective layer against the ion irradiation, such as a silicon nitride film, a silicon nitride oxide film, or a silicon oxide film may be provided to a thickness of 50 to 200 nm on the surface to be irradiated with ions.

For example, a stack of a silicon oxynitride film (a thickness of 5 nm to 300 nm, preferably 30 nm to 150 nm (for example, 50 nm)) and a silicon nitride oxide film (a thickness of 5 nm to 150 nm, preferably 10 to 100 nm (for example, 50 nm)) is formed as the protective layer over the single crystal semiconductor substrate 1108 by a plasma CVD method. As an example, a silicon oxynitride film is formed to a thickness of 50 nm over the single crystal semiconductor substrate 1108, and a silicon nitride oxide film is formed to a thickness of 50 nm over the silicon oxynitride film. Instead of the silicon oxynitride film, a silicon oxide film formed by a chemical vapor deposition method using an organosilane gas may be used.

Alternatively, thermal oxidation may be performed after the single crystal semiconductor substrate 1108 is degreased and cleaned and an oxide film on the surface is removed. As thermal oxidation, general dry oxidation may be performed, and preferably, oxidation in an oxidizing atmosphere to which halogen is added is performed. For example, heat treatment is performed at a temperature of 700° C. or higher in an atmosphere containing HCl at 0.5 to 10 volume % (preferably 3 volume %) with respect to oxygen. Thermal oxidation is preferably performed at a temperature of 950 to 1100° C. The processing time may be 0.1 to 6 hours, preferably 0.5 to 3.5 hours. The thickness of the oxide film to be formed is 10 to 1000 nm (preferably 50 to 200 nm), and for example, the thickness is 100 nm.

As a substance containing halogen, other than HCl, one or more of HF, $NF_3$, HBr, $Cl_2$, $ClF_3$, $BCl_3$, $F_2$, $Br_2$, dichloroethylene, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by action of chlorine and removed. The heat treatment has an advantageous effect on the case where the surface of the single crystal semiconductor substrate 1108 is subjected to a chemical mechanical polishing (CMP) process. Further, hydrogen has an effect of compensating a defect at the interface between the single crystal semiconductor substrate 1108 and an insulating layer to be formed so as to reduce local level density at the interface, and thus the interface between the single crystal semiconductor substrate 1108 and the insulating layer is inactivated to stabilize electric characteristics.

Halogen can be contained in the oxide film formed by the heat treatment. A halogen element is contained at a concentration of $1\times10^{17}$ to $5\times10^{20}$ atoms/$cm^3$, whereby the oxide film can function as a protective layer which captures impurities such as metal to prevent contamination of the single crystal semiconductor substrate 1108.

When the embrittlement layer 1110 is formed, the accelerating voltage and the total number of ions can be adjusted depending on the thickness of films deposited on the single crystal semiconductor substrate, the thickness of the targeted single crystal semiconductor layer which is separated from the single crystal semiconductor substrate and transferred to a light-transmitting substrate, and ion species with which irradiation is performed.

For example, a hydrogen gas is used for a raw material, and irradiation of ions is performed at an accelerating voltage of 40 kV with the total ion number of $2\times10^{16}$ ions/$cm^2$ by an ion doping method, so that the embrittlement layer can be formed. If the protective layer is formed to be thick and irradiation of ions is performed under the same conditions to form the embrittlement layer, a thin single crystal semiconductor layer can be formed as a targeted single crystal semiconductor layer which is separated from the single crystal semiconductor substrate and transferred (transposed) to the light-transmitting substrate. For example, although it depends on the proportion of ion species ($H^+$ ions, $H_2^+$ ions, and $H_3^+$ ions), when the embrittlement layer is formed under the above conditions and a silicon oxynitride film (a thickness of 50 nm) and a silicon nitride oxide film (a thickness of 50 nm) are stacked as a protective layer over the single crystal semiconductor substrate, the thickness of the single crystal semiconductor layer to be transferred to the light-transmitting substrate is approximately 120 nm. Alternatively, when a silicon oxynitride film (a thickness of 100 nm) and a silicon nitride oxide film (a thickness of 50 nm) are stacked as a protective layer over the single crystal semiconductor substrate, the thickness of the single crystal semiconductor layer to be transferred to the light-transmitting substrate is approximately 70 nm.

When helium (He) or hydrogen is used for a source gas, irradiation is performed at an accelerating voltage of 10 to 200 kV with a dose of $1\times10^{16}$ to $6\times10^{16}$ ions/$cm^2$, so that the embrittlement layer can be formed. When helium is used for the source gas, irradiation of $He^+$ ions as main ions can be performed without mass separation. Further, when hydrogen is used for the source gas, irradiation of $H_3$ ions and $H_2^+$ ions as main ions can be performed. Ion species are changed depending on a plasma generation method, pressure, the supply quantity of source gas, or an accelerating voltage.

As an example of forming the embrittlement layer, a silicon oxynitride film (a thickness of 50 nm), a silicon nitride oxide film (a thickness of 50 nm), and a silicon oxide film (a thickness of 50 nm) are stacked as a protective layer over the single crystal semiconductor substrate, and irradiation of hydrogen is performed at an accelerating voltage of 40 kV with a dose of $2\times10^{16}$ ions/$cm^2$, so that the embrittlement layer is formed in the single crystal semiconductor substrate. After that, a silicon oxide film (a thickness of 50 nm) is formed as an insulating layer having a bonding surface over the silicon oxide film, which is an uppermost layer of the protective layer. As another example of forming the embrittlement layer, a silicon oxide film (a thickness of 100 nm) and a silicon nitride oxide film (a thickness of 50 nm) are stacked as a protective layer over the single crystal semiconductor substrate, and irradiation of hydrogen is performed at an accelerating voltage of 40 kV with a dose of $2\times10^{16}$ ions/$cm^2$, so that the embrittlement layer is formed in the single crystal semiconductor substrate. After that, a silicon oxide film (a thickness of 50 nm) is formed as an insulating layer having a bonding surface over the silicon nitride oxide film, which is an uppermost layer of the protective layer. Note that the silicon oxynitride film and the silicon nitride oxide film may be formed by a plasma CVD method, and the silicon oxide film may be formed by a CVD method using an organosilane gas.

Alternatively, an insulating layer may be formed between the light-transmitting substrate and the single crystal semiconductor substrate. The insulating layer may be formed on either the light-transmitting substrate side or the single crystal semiconductor substrate side, or both of the sides. An insulating layer formed on a surface which is to be bonded has a smooth surface and forms a hydrophilic surface. A silicon oxide film can be used as the insulating layer. As the silicon oxide film, a silicon oxide film formed by a chemical vapor deposition method using an organosilane gas is preferably used. Alternatively, a silicon oxide film formed by a chemical vapor deposition method using a silane gas may be used.

Examples of organosilane gas which can be used are silicon-containing compounds such as tetraethyl orthosilicate (TEOS: $Si(OC_2H_5)_4$), trimethylsilane (TMS: $(CH_3)_3SiH$), tetramethylsilane ($Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$). Note that when a silicon oxide layer is formed by a chemical vapor deposition method using organosilane for a source gas, it is preferable to mix a gas which provides oxygen. Oxygen, nitrous oxide, nitrogen dioxide, or the like can be used as the gas which provides oxygen. Further, an inert gas such as argon, helium, nitrogen, or hydrogen may be mixed.

Alternatively, as the insulating layer formed on the surface which is to be bonded, a silicon oxide film formed by a chemical vapor deposition method using silane such as monosilane, disilane, or trisilane for a source gas may be used. Also in this case, it is preferable to mix an inert gas, a gas which provides oxygen, or the like. Further, the silicon oxide film to serve as an insulating layer bonded to the single crystal semiconductor layer may contain chlorine. Note that in this specification, a chemical vapor deposition (CVD) method includes a plasma CVD method, a thermal CVD method, and a photo-CVD method in its category.

Alternatively, as the insulating layer formed on the surface which is to be bonded, silicon oxide formed by heat treatment in an oxidizing atmosphere, silicon oxide which grows by reaction of oxygen radicals, chemical oxide formed with an oxidizing chemical solution, or the like may be used. As the insulating layer, an insulating layer having a siloxane (Si—O—Si) bond may be used. Further, the insulating layer may be formed by reaction between the organosilane gas and oxygen radicals or nitrogen radicals.

The surface of the insulating layer, which is to be bonded, is preferably set as follows: arithmetic mean roughness Ra is less than 0.8 nm and root-mean-square roughness Rms is less than 0.9 nm; more preferably, Ra is 0.4 nm or less and Rms is 0.5 nm or less; still preferably, Ra is 0.3 nm or less and Rms is 0.4 nm or less. For example, Ra is 0.27 nm and Rms is 0.34 nm. In this specification, Ra is arithmetic mean roughness; Rms is root-mean-square roughness; and the measurement area is 2 $\mu m^2$ or 10 $\mu m^2$.

When the light-transmitting substrate and the single crystal semiconductor substrate are bonded to each other, a strong bond can be formed by providing an insulating layer which is formed of a silicon oxide film preferably using organosilane for a raw material on one or both of surfaces which are to be bonded to each other.

Figure 15B:
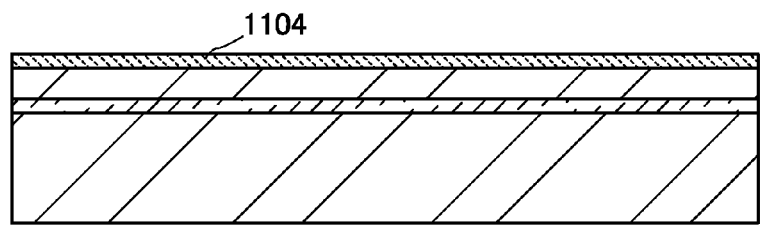

In this embodiment, as illustrated in FIG. 15B, a silicon oxide film is formed as an insulating layer 1104 on the surface which is bonded to the light-transmitting substrate. As the silicon oxide film, a silicon oxide film formed by a chemical vapor deposition method using an organosilane gas is preferably used. Alternatively, a silicon oxide film formed by a chemical vapor deposition method using a silane gas may be used. In deposition by a chemical vapor deposition method, a deposition temperature of, for example, 350° C. or lower (300° C. as a specific example) is applied as the temperature at which degasification does not occur from the embrittlement layer 1110 formed in the single crystal semiconductor substrate. Further, heat treatment temperature which is higher than the deposition temperature is applied to heat treatment by which the single crystal semiconductor layer is separated from the single crystal semiconductor substrate.

The light-transmitting substrate may be provided with a silicon nitride film or a silicon nitride oxide film which prevents diffusion of an impurity element as a blocking layer (also referred to as a barrier layer). Further, a silicon oxynitride film may be combined as an insulating film having a function of relieving stress.

Figure 15C:
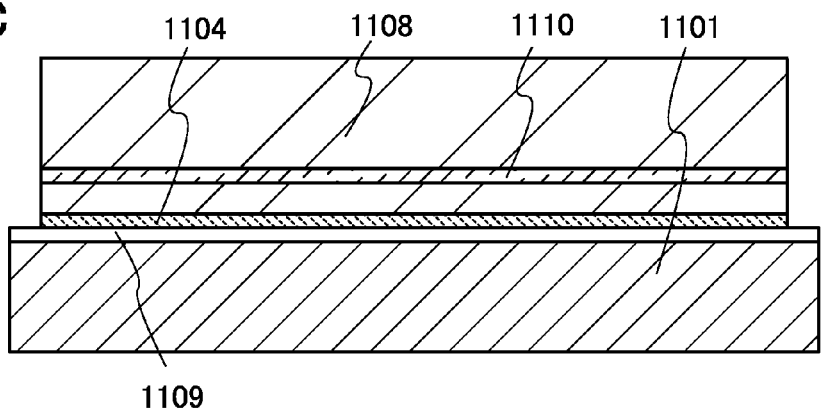

FIG. 15C illustrates a mode in which a blocking layer 1109 provided over a light-transmitting substrate 1101 and a surface of the single crystal semiconductor substrate 1108, on which the insulating layer 1104 is formed, are disposed in close contact with each other and bonded to each other. The surfaces which are to be bonded to each other are cleaned sufficiently. The surface of the blocking layer 1109 provided over the light-transmitting substrate 1101 and the surface of the single crystal semiconductor substrate 1108, on which the insulating layer 1104 is formed, may be cleaned by megasonic cleaning or the like. Further, the surfaces may be cleaned with ozone water after megasonic cleaning, so that an organic substance can be removed and the hydrophilicity of the surfaces can be improved.

By making the blocking layer 1109 over the light-transmitting substrate 1101 and the insulating layer 1104 face each other and pressing one part thereof from the outside, the blocking layer 1109 and the insulating layer 1104 attract each other by increase in van der Waals forces or influence of hydrogen bonding due to local reduction in distance between the bonding surfaces. Further, since the distance between the blocking layer 1109 over the light-transmitting substrate 1101 and the insulating layer 1104 which face each other in an adjacent region is also reduced, a region in which van der Waals forces strongly act or a region which is influenced by hydrogen bonding is increased. Accordingly, bonding proceeds and spreads to the entire bonding surfaces.

When the blocking layer 1109 and the insulating layer 1104 are pressed against each other so that one of the four corners of the substrate is pressed at a pressure of 100 to 5000 kPa, the bonding surfaces come close to each other; thus, the bonding can shift from Van der Waals force to hydrogen bonding. When the bonding surfaces at one portion come close to each other in the substrate, the bonding surfaces at the adjacent portion also come close to each other and the bonding shifts to hydrogen bonding; thus, the bonding at the entire surfaces can shift to hydrogen bonding.

In order to form a favorable bond, the surface may be activated. For example, the surface which is to be bonded is irradiated with an atomic beam or an ion beam. When an atomic beam or an ion beam is used, an inert gas neutral atom beam or an inert gas ion beam of argon or the like can be used. Alternatively, plasma irradiation or radical treatment is performed. Such surface treatment makes it easier to form a bond between materials of different kinds even at a temperature of 200 to 400° C.

Further, in order to increase bonding strength of a bonding interface between the light-transmitting substrate and the insulating layer, heat treatment is preferably performed. For example, heat treatment is performed at a temperature of 70 to 350° C. (for example, at 200° C. for 2 hours) in an oven, a furnace, or the like.

Figure 15D:
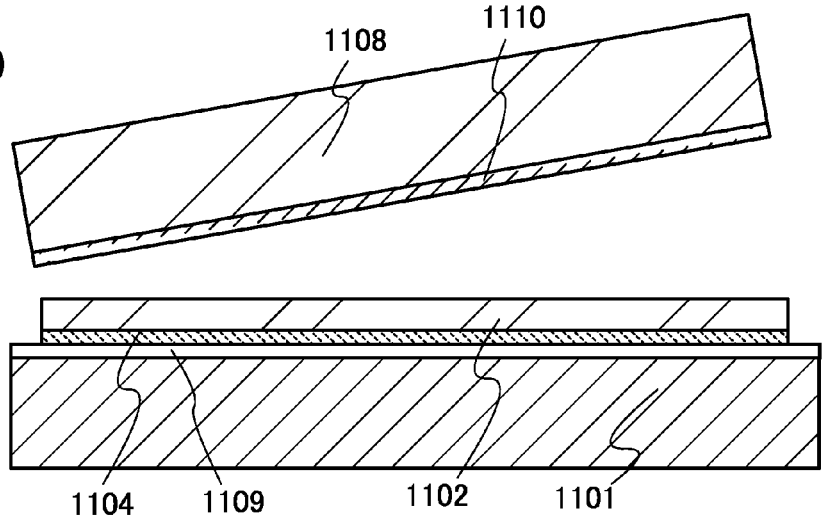

In FIG. 15D, after the light-transmitting substrate 1101 and the single crystal semiconductor substrate 1108 are attached to each other, heat treatment is performed, and the single crystal semiconductor substrate 1108 is separated from the light-transmitting substrate 1101 by using the embrittlement layer 1110 as a cleavage plane. When heat treatment is performed at, for example, 400 to 700° C., the volume of the microvoids formed in the embrittlement layer 1110 is changed, which enables cleavage along the embrittlement layer 1110. Since the insulating layer 1104 is bonded to the light-transmitting substrate 1101 with the blocking layer 1109 interposed therebetween, a single crystal semiconductor layer 1102 having the same crystallinity as the single crystal semiconductor substrate 1108 is left over the light-transmitting substrate 1101.

Heat treatment in a temperature range of 400 to 700° C. may be continuously performed in the apparatus same as that for the above heat treatment for increasing bonding strength or in another apparatus. For example, after heat treatment in a furnace at 200° C. for 2 hours, the temperature is increased to near 600° C. and held for 2 hours; the temperature is decreased to a temperature ranging from 400° C. to room temperature; and then the substrate is taken out of the furnace. Alternatively, heat treatment may be performed at the temperature increasing from room temperature. Further, after heat treatment is performed in a furnace at 200° C. for 2 hours, heat treatment may be performed in a temperature range of 600 to 700° C. in a rapid thermal annealing (RTA) apparatus for 1 minute to 30 minutes (for example, at 600° C. for 7 minutes or at 650° C. for 7 minutes).

By heat treatment in a temperature range of 400 to 700° C., bonding between the insulating layer and the light-transmitting substrate shifts from hydrogen bonding to covalent bonding, and an element added to the embrittlement layer is separated out and the pressure rises, whereby the single crystal semiconductor layer can be separated from the single crystal semiconductor substrate. After the heat treatment, one of the light-transmitting substrate and the single crystal semiconductor substrate is provided over the other, and the light-transmitting substrate and the single crystal semiconductor substrate can be separated from each other without application of large force. For example, one substrate located over the other substrate is lifted by a vacuum chuck, so that the substrate can be easily separated. At this time, if the substrate on a lower side is fixed with a vacuum chuck or a mechanical chuck, the light-transmitting substrate and the single crystal semiconductor substrate can be separated from each other without horizontal misalignment.

Note that FIGS. 15A to 15D and FIGS. 16A to 16C illustrate an example in which the single crystal semiconductor substrate 1108 is smaller than the light-transmitting substrate 1101; however, the present invention is not limited thereto, and the single crystal semiconductor substrate 1108 and the light-transmitting substrate 1101 may have the same size or the single crystal semiconductor substrate 1108 may be larger than the light-transmitting substrate 1101.

Figure 16A:
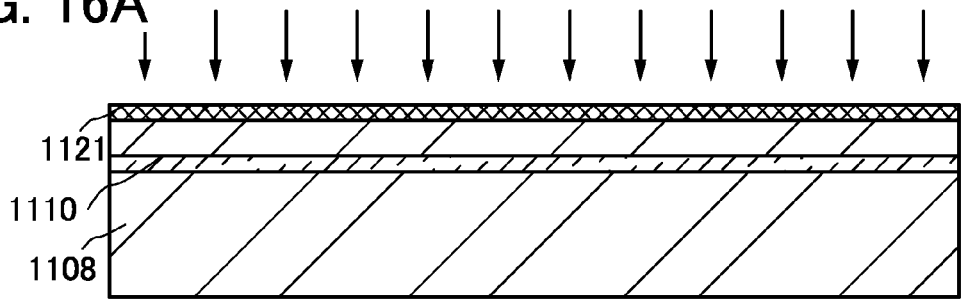
FIGS. 16A to 16C illustrate a method for manufacturing a semiconductor device, according to an embodiment of the present invention.
Figure 16B:
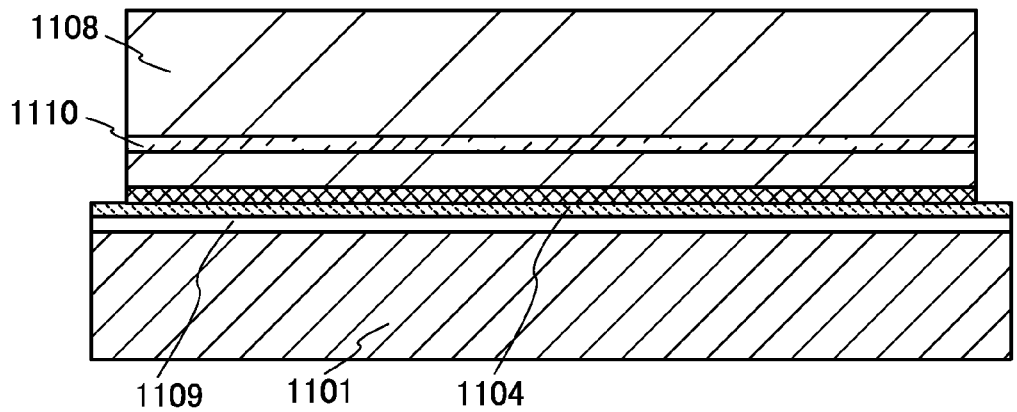
Figure 16C:
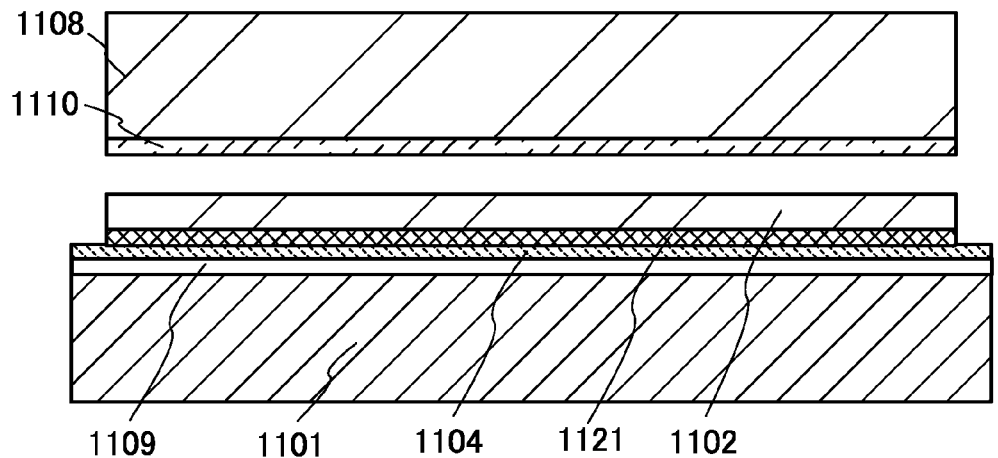

FIGS. 16A to 16C illustrate steps in which an insulating layer is provided on the light-transmitting substrate side and a single crystal semiconductor layer is formed. FIG. 16A illustrates a step in which irradiation of ions accelerated by an electric field is performed to a predetermined depth of the single crystal semiconductor substrate 1108 provided with a silicon oxide film as a protective layer 1121 to form the embrittlement layer 1110. Ton irradiation is performed in a manner similar to that in the case of FIG. 15A. By forming the protective layer 1121 on the surface of the single crystal semiconductor substrate 1108, the surface can be prevented from being damaged by ion irradiation and losing the planarity. Further, the protective layer 1121 has an advantageous effect of preventing diffusion of impurities into the single crystal semiconductor layer 1102 formed from the single crystal semiconductor substrate 1108.

FIG. 16B illustrates a step in which the light-transmitting substrate 1101 provided with the blocking layer 1109 and the insulating layer 1104 is disposed in close contact with the surface of the single crystal semiconductor substrate 1108, on which the protective layer 1121 is formed, to form a bond. The bond is formed by disposing the insulating layer 1104 over the light-transmitting substrate 1101 in close contact with the protective layer 1121 over the single crystal semiconductor substrate 1108.

After that, the single crystal semiconductor substrate 1108 is separated as illustrated in FIG. 16C. Heat treatment for separating a single crystal semiconductor layer is performed in a manner similar to that in the case of FIG. 15D. Thus, a semiconductor substrate having an SOI structure, according to an embodiment of the present invention, which includes the single crystal semiconductor layer over the substrate with the insulating layer interposed therebetween can be obtained as illustrated in FIG. 16C.

In some cases, the single crystal semiconductor layer which is separated from the single crystal semiconductor substrate and transferred to the light-transmitting substrate has crystal defects due to the separation step and the ion implantation step and thus loses surface planarity and has unevenness. In the case where a transistor is formed as a semiconductor element by using the single crystal semiconductor layer, it is difficult to form a thin gate insulating layer with a high withstand voltage on the surface of the single crystal semiconductor layer having such unevenness. Further, if the single crystal semiconductor layer has crystal defects, performance and reliability of the transistor are adversely affected; for example, a localized interface state density with the gate insulating layer is increased.

Therefore, the single crystal semiconductor layer is preferably irradiated with electromagnetic waves such as a laser beam to reduce crystal defects. At least part of the single crystal semiconductor layer is melted by irradiation with electromagnetic waves, whereby crystal defects in the single crystal semiconductor layer can be reduced. Note that an oxide film (a native oxide film or a chemical oxide film) formed on the surface of the single crystal semiconductor layer may be removed by dilute hydrofluoric acid before irradiation with the electromagnetic waves.

Any electromagnetic wave may be used as long as it provides high energy to the single crystal semiconductor layer, and a laser beam can be preferably used.

Alternatively, the energy can be supplied mainly by heat conduction which is caused by colliding the particles having high energy with the single crystal semiconductor layer by irradiation or the like. As a heat source for supplying the particles having high energy, plasma such as atmospheric-pressure plasma, high-pressure plasma, or a thermal plasma jet, a flame of a gas burner, or the like can be used. Alternatively, an electron beam or the like can be used.

A wavelength of the electromagnetic wave is set so that it is absorbed by the single crystal semiconductor layer. The wavelength can be determined in consideration of the skin depth of the electromagnetic wave or the like. For example, the wavelength of the electromagnetic wave can be 190 to 600 nm. Moreover, the electromagnetic wave energy can be determined in consideration of the wavelength of the electromagnetic wave, the skin depth of the electromagnetic wave, the thickness of the single crystal semiconductor layer to be irradiated, or the like.

A laser emitting laser beam can be a continuous wave laser, a pseudo continuous wave laser, or a pulsed laser. A pulsed laser is preferably used for partial melting. For example, an excimer laser such as a KrF laser, or a gas laser such as an Ar laser or a Kr laser can be used. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, and the like can be used. Note that an excimer laser is a pulsed laser, and some solid-state lasers such as a YAG laser can be used as a continuous wave laser, a pseudo continuous wave laser, and a pulsed laser. In addition, as for a solid-state laser, the second to fifth harmonics of a fundamental wave can be preferably used. Further, a semiconductor laser of GaN, GaAs, GaAlAs, InGaAsP, or the like can be used.

If the single crystal semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high-pressure sodium lamp, or a high-pressure mercury lamp may be used. Flash annealing with the use of the above lamp light may be used. Since flash annealing which is performed by preferably using a halogen lamp, a xenon lamp, or the like takes very short treatment time, heating up of the light-transmitting substrate can be suppressed.

A shutter, a reflector such as a mirror or a half mirror, an optical system including a cylindrical lens, a convex lens, or the like may be provided in order to adjust the shape or the path of electromagnetic waves.

Note that for irradiation with electromagnetic waves, an electromagnetic wave may be selectively emitted, or light (an electromagnetic wave) can be emitted by scanning the light (the electromagnetic wave) in the X-Y directions. In this case, a polygon mirror or a galvanometer mirror is preferably used in the optical system.

Irradiation with electromagnetic waves can be performed in an atmosphere which contains oxygen, such as an atmospheric atmosphere, or in an inert atmosphere such as a nitrogen atmosphere. In order to perform irradiation with electromagnetic waves in an inert atmosphere, irradiation with electromagnetic waves may be performed in an airtight chamber an atmosphere in which is controlled. In the case where a chamber is not used, a nitrogen atmosphere can be formed by spraying an inert gas such as a nitrogen gas on a surface to be irradiated with electromagnetic waves.

Further, polishing treatment may be performed on the surface of the single crystal semiconductor layer to which high energy is supplied by electromagnetic wave irradiation or the like to reduce crystal defects. Polishing treatment can enhance the planarity of the surface of the single crystal semiconductor layer.

For the polishing treatment, a chemical mechanical polishing (CMP) method or a liquid jet polishing method can be used. Note that the surface of the single crystal semiconductor layer is cleaned to be purified before the polishing treatment. The cleaning may be performed by megasonic cleaning, two-fluid jet cleaning, or the like; and dust or the like on the surface of the single crystal semiconductor layer is removed by the cleaning. Further, it is preferable to remove a native oxide film or the like on the surface of the single crystal semiconductor layer by using a dilute hydrofluoric acid to expose the single crystal semiconductor layer.

Further, polishing treatment (or etching treatment) may be performed on the surface of the single crystal semiconductor layer before irradiation with electromagnetic waves.

Further, when the single crystal semiconductor layer is transferred from the single crystal semiconductor substrate, the single crystal semiconductor substrate is selectively etched, and a plurality of single crystal semiconductor layers of which shapes are processed may be transferred to a light-transmitting substrate. A plurality of island-shaped single crystal semiconductor layers can be formed over the light-transmitting substrate. Since the single crystal semiconductor layers of which shapes are processed in advance are transferred from the single crystal semiconductor substrate, there is no limitation on the size and shape of the single crystal semiconductor substrate. Therefore, the single crystal semiconductor layers can be more efficiently transferred to a large light-transmitting substrate.

Further, the single crystal semiconductor layer which is bonded to the light-transmitting substrate is etched so that the shape of the single crystal semiconductor layer may be processed, modified, and controlled precisely. Accordingly, the single crystal semiconductor layer can be processed to have the shape of a semiconductor element, and error in a formation position and a defect in the shape of the single crystal semiconductor layer due to pattern misalignment caused by light in light exposure for forming a resist mask, which goes around the resist mask, positional misalignment caused by a bonding step in transferring the single crystal semiconductor layer, or the like can be modified.

Accordingly, a plurality of single crystal semiconductor layers having a desired shape can be formed over the light-transmitting substrate with high yield. Accordingly, a semiconductor device which includes a semiconductor element and an integrated circuit that have more precise and high performance can be manufactured over a large substrate with high throughput and high productivity.

After being separated from the single crystal semiconductor substrate, the single crystal semiconductor layer may be bonded to the light-transmitting substrate. The surface of the single crystal semiconductor layer which is exposed by cleavage may face and be bonded to the light-transmitting substrate or may be bonded to the light-transmitting substrate so as to be in contact with the gate insulating film.

In this embodiment, when a single crystal silicon substrate is used as the single crystal semiconductor substrate 1108, a single crystal silicon layer can be obtained as the single crystal semiconductor layer 1102. Further, since a method for manufacturing a semiconductor device in this embodiment allows the process temperature to be 700° C. or lower, a glass substrate can be used as the light-transmitting substrate 1101. That is, a transistor can be formed over a glass substrate in a manner similar to that of a conventional thin film transistor, and a single crystal silicon layer can be used for the semiconductor layer. Accordingly, it is possible to form a transistor with high performance and high reliability, which can operate at high speed, has a low subthreshold value and high field effect mobility, and can be driven with low voltage consumption, over a light-transmitting substrate such as a glass substrate.

This embodiment can be combined with Embodiment 1 as appropriate.

Embodiment 3

This embodiment describes an example of steps of bonding a single crystal semiconductor layer from a single crystal semiconductor substrate to a light-transmitting substrate, which are different from those in Embodiment 2. Accordingly, description of the same portion or a portion having a similar function to the portion in Embodiment 2 is omitted.

First, processing on the single crystal substrate side is described. In this embodiment, a single crystal semiconductor substrate is degreased and cleaned to remove an oxide film on the surface, and thermal oxidation is performed. As thermal oxidation, oxidation in an oxidizing atmosphere to which halogen is added is preferably performed. For example, heat treatment is performed at a temperature of 700° C. or higher in an atmosphere containing HCl at 0.5 to 10 volume % (preferably 3 volume %) with respect to oxygen. Thermal oxidation is preferably performed at a temperature of 950 to 1100° C. The processing time may be 0.1 to 6 hours, preferably 0.5 to 3.5 hours. The thickness of the oxide film to be formed is 10 to 1000 nm (preferably 50 to 200 nm) and for example, the thickness is 100 nm.

As a substance containing halogen, other than HCl, one or more of HF, $NF_3$, HBr, $Cl_2$, $ClF_3$, $BCl_3$, $F_2$, $Br_2$, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by action of chlorine and removed. The heat treatment has an advantageous effect on the case where the surface of the single crystal semiconductor substrate is subjected to chemical mechanical polishing (CMP). Further, hydrogen has an effect of compensating a defect at the interface between the single crystal semiconductor substrate and an insulating layer to be formed over a light-transmitting substrate so as to reduce local level density at the interface, and thus the interface between the single crystal semiconductor substrate and the insulating layer is inactivated to stabilize electric characteristics.

Halogen can be contained in the oxide film formed by the heat treatment. A halogen element is contained at a concentration of $1\times10^{17}$ to $5\times10^{20}$ atoms/cm$^3$, whereby the oxide film can function as a protective layer which captures impurities such as metal to prevent contamination of the single crystal semiconductor substrate.

Ions are introduced into the single crystal semiconductor substrate to form an embrittlement layer. The depth of a region where the embrittlement layer is formed can be adjusted by the acceleration energy of the ions to be introduced and the angle at which the ions enter. The acceleration energy can be adjusted by an acceleration voltage, a dose, or the like.

As a gas used in ion introduction, a hydrogen gas, a rare gas, or the like is used. In this embodiment, a hydrogen gas is preferably used. When a hydrogen gas is used in an ion doping method, generated ion species are $H^+$, $H_2^+$, and $H_3^+$, and it is preferable that $H_3^+$ be introduced to the single crystal semiconductor substrate in the largest amount. $H_3^+$ has higher introduction efficiency than $H^+$ or $H_2^+$, so that introduction time can be reduced. Further, a crack is easily generated in the embrittlement layer in a later step.

Next, processing on the light-transmitting substrate side is described. First, a surface of the light-transmitting substrate is cleaned. For cleaning, ultrasonic cleaning may be performed with a hydrochloric acid hydrogen peroxide mixture (HPM), a sulfuric acid hydrogen peroxide mixture (SPM), an ammonia hydrogen peroxide mixture (APM), diluted hydrogen fluoride (DHF), or the like. In this embodiment, ultrasonic cleaning is performed with a hydrochloric acid hydrogen peroxide mixture.

Then, planarization treatment by plasma treatment is performed on the light-transmitting substrate from which impurities such as dust on the surface are removed by cleaning. In this embodiment, plasma treatment is performed in such a manner that an inert gas such as an argon (Ar) gas is used in a vacuum chamber and a bias voltage is applied to the light-transmitting substrate to be processed to generate plasma. An oxygen ($O_2$) gas or a nitrogen ($N_2$) gas may be introduced together with the inert gas.

The light-transmitting substrate is set to be in the cathode direction, and positive ions of Ar in the plasma are accelerated in the cathode direction to collide with the light-transmitting substrate. By collision of the Ar positive ions, the surface of the light-transmitting substrate is sputter-etched. Accordingly, a projection on the surface of the light-transmitting substrate is etched, so that the surface of the light-transmitting substrate can be planarized. A reactive gas has an advantageous effect of repairing defects caused by sputter etching of the surface of the light-transmitting substrate.

Next, an insulating layer is formed over the light-transmitting substrate. In this embodiment, an oxide film containing aluminum oxide as its main component, which is other than a silicon-based insulating layer, is used. The oxide film containing aluminum oxide as its main component refers to an oxide film in which aluminum oxide is contained at least 10% by weight where the total amount of all components in the oxide film is 100% by weight. Alternatively, as the insulating layer, a film which contains aluminum oxide as its main component and also contains one or both of magnesium oxide and strontium oxide can be used. Note that aluminum oxide containing nitrogen may be used.

The insulating layer can be formed by a sputtering method. As a target used in a sputtering method, for example, metal containing aluminum or metal oxide such as aluminum oxide can be used. Note that a material of the target may be selected as appropriate depending on the film to be formed.

In the case where metal is used as the target, the insulating layer is formed in such a manner that sputtering is performed while a reactive gas (for example, oxygen) is introduced (by a reactive sputtering method). As the metal, magnesium (Mg); an alloy containing aluminum and magnesium; an alloy containing aluminum and strontium (Sr); or an alloy containing aluminum, magnesium, and strontium can be used other than aluminum. In this case, sputtering may be performed using a direct current (DC) power supply or a radio frequency (RF) power supply.

In the case where metal oxide is used as the target, the insulating layer is formed by sputtering with a radio frequency (RF) power supply (by an RF sputtering method). As the metal oxide, magnesium oxide; strontium oxide; oxide containing aluminum and magnesium; oxide containing aluminum and strontium; or oxide containing aluminum, magnesium, and strontium can be used other than aluminum oxide.

Alternatively, the insulating layer may be formed by a bias sputtering method. In the case where a bias sputtering method is used, a film can be deposited while a surface of the film can be planarized.

The oxide film containing aluminum as its main component can prevent impurities such as moisture and mobile ions included in the light-transmitting substrate from diffusing into a single crystal semiconductor layer to be provided over the light-transmitting substrate later.

Next, the surface of the single crystal semiconductor substrate and the surface of the light-transmitting substrate are made to face each other, and the single crystal semiconductor substrate and the insulating layer are bonded to each other. The single crystal semiconductor substrate and a surface of the insulating layer formed over the light-transmitting substrate are disposed in close contact with each other, so that a bond is formed.

Note that before the single crystal semiconductor substrate and the light-transmitting substrate are bonded to each other, surface treatment is preferably performed on the insulating layer formed over the light-transmitting substrate.

Then, as in Embodiment 2, heat treatment is performed to carry out separation (cleavage) along the embrittlement layer, whereby a single crystal semiconductor layer can be provided over the light-transmitting substrate with the insulating layer interposed therebetween.

A semiconductor integrated circuit portion can be formed using the single crystal semiconductor layer provided over the light-transmitting substrate.

Next, steps of repeatedly using a separated single crystal semiconductor substrate (process for reprocessing a semiconductor substrate) are described.

First, a separated single crystal semiconductor substrate is taken out. In some cases, an end portion of the single crystal semiconductor substrate is not sufficiently bonded to the light-transmitting substrate due to edge roll-off. As a result of this, in some cases, the end portion of the single crystal semiconductor substrate is not separated along the embrittlement layer, so that the insulating layer or the like is left.

A residue on the end portion of the single crystal semiconductor substrate is removed. The residue can be removed by wet etching treatment. Specifically, wet etching is performed using a mixture solution containing hydrofluoric acid, ammonium fluoride, and surfactant (for example, product name: LAL500 manufactured by Stella Chemifa Corporation) as an etchant.

Further, the embrittlement layer into which hydrogen ions are introduced can be removed by wet etching using an organic alkaline aqueous solution typified by tetramethylammonium hydroxide (TMAH). By performing such treatment, a step due to the residue on the end portion of the single crystal semiconductor substrate is reduced.

Next, the single crystal semiconductor substrate is oxidized in a halogen atmosphere to form an oxide film, and after that, the oxide film is removed. Hydrogen chloride (HCl) can be used as the halogen. Accordingly, a gettering effect by a halogen element can be obtained. Gettering particularly has an effect of removing metal impurities. That is, impurities such as metal change into volatile chloride and are released into air by action of chlorine and removed.

Then, a CMP process is performed on the single crystal semiconductor substrate as polishing treatment. Thus, the step in the end portion of the single crystal semiconductor substrate is removed, and the surface of the single crystal semiconductor substrate can be planarized. After that, the obtained single crystal semiconductor substrate is used again as a base wafer.

As described in this embodiment, by repeatedly using a single crystal semiconductor substrate through the steps of reprocessing a single crystal semiconductor substrate, cost reduction can be achieved. Further, by using the steps of reprocessing a single crystal semiconductor substrate described in this embodiment, a surface of the single crystal semiconductor substrate can be sufficiently planarized even when the single crystal semiconductor substrate is repeatedly used. Accordingly, adhesion between the single crystal semiconductor substrate and the light-transmitting substrate can be increased and bonding defects can be reduced.

This embodiment can be combined with any of Embodiment 1 and Embodiment 2 as appropriate.

Embodiment 4

In this embodiment, a variety of examples of electronic appliances each of which includes a sensor obtained according to an embodiment of the present invention are described. Examples of electronic appliances to which an embodiment of the present invention is applied include a computer, a display, a mobile phone, a television device, and the like. Specific examples of those electronic appliances are illustrated in FIGS. 10A to 10C, FIGS. 11A and 11B, FIG. 12, FIGS. 13A and 13B, and FIG. 14.

Figure 10A:
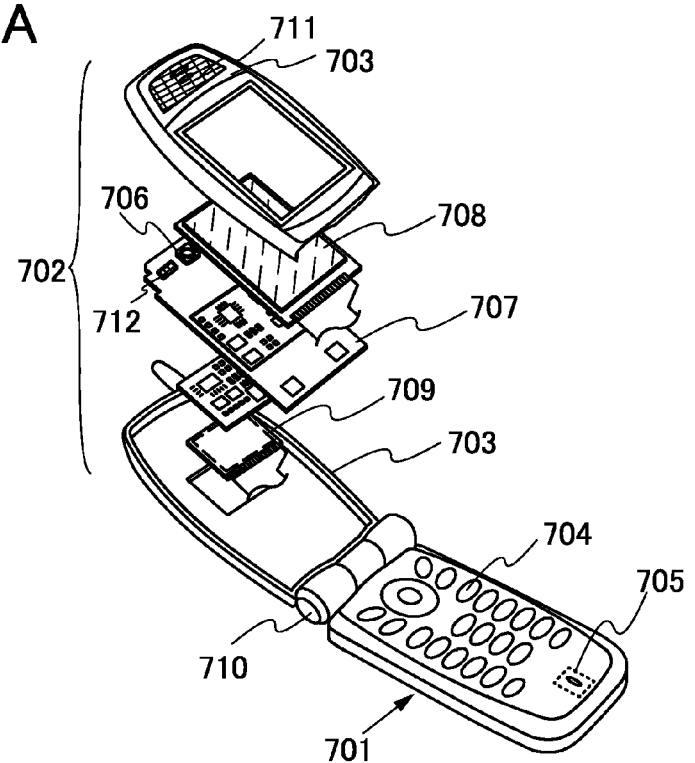
FIGS. 10A to 10C each illustrate a device on which a semiconductor device according to an embodiment of the present invention is mounted.
Figure 10B:
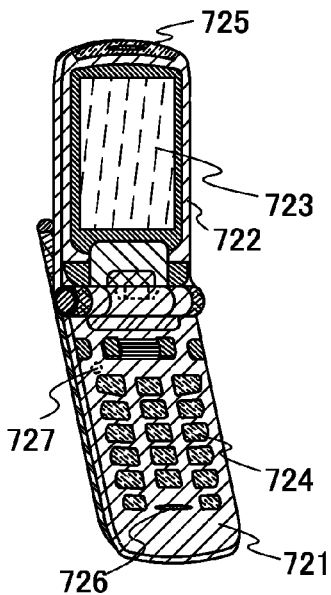
Figure 10C:
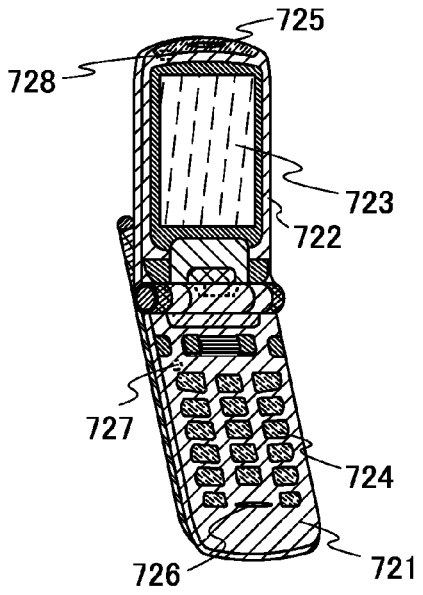

FIGS. 10A to 10C illustrate mobile phones and the mobile phone in FIG. 10A includes a main body (A) 701, a main body (B) 702, a housing 703, operation keys 704, an audio output portion 705, an audio input portion 706, a circuit substrate 707, a display panel (A) 708, a display panel (B) 709, a hinge 710, a light-transmitting material portion 711, and a sensor 712.

The sensor 712 detects the light which is transmitted through the light-transmitting material portion 711, and luminance of the display panel (A) 708 and the display panel (B) 709 are controlled based on illuminance of detected ambient light, or illumination of the operation keys 704 is controlled based on illuminance obtained by the sensor 712. Accordingly, current consumption of the mobile phone can be reduced.

FIGS. 10B and 10C illustrate another example of a mobile phone. In FIGS. 10B and 10C, reference numeral 721 denotes the main body, 722 denotes a housing, 723 denotes a display panel, 724 denotes operation keys, 725 denotes an audio output portion, 726 denotes an audio input portion, 727 denotes a sensor, and 728 denotes a sensor.

In the mobile phone illustrated in FIG. 10B, luminance of the display panel 723 and the operation keys 724 can be controlled by detecting ambient light by the sensor 727 which is provided in the main body 721.

In the mobile phone illustrated in FIG. 10C, the sensor 728 is provided inside the main body 721 in addition to the structure of FIG. 10B. By the sensor 728, luminance of the backlight which is provided in the display panel 723 can also be detected.

Figure 11A:
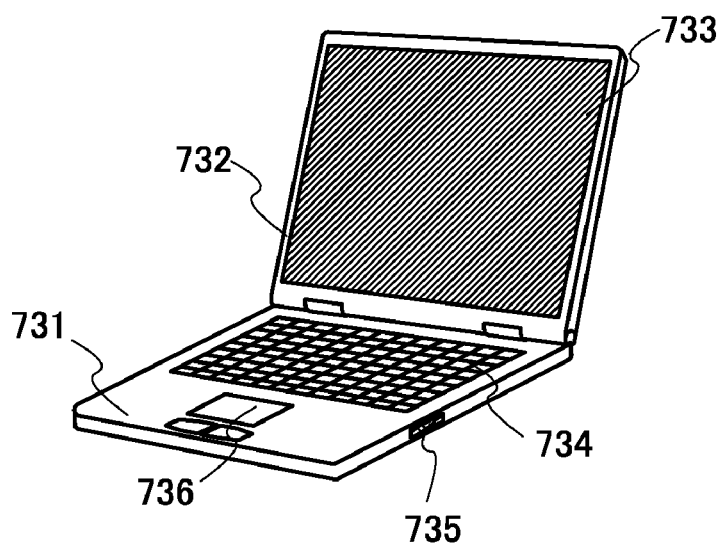
FIGS. 11A and 11B each illustrate a device on which a semiconductor device according to an embodiment of the present invention is mounted.

FIG. 11A illustrates a computer including a main body 731, a housing 732, a display portion 733, a keyboard 734, an external connection port 735, a pointing device 736, and the like.

Figure 11B:
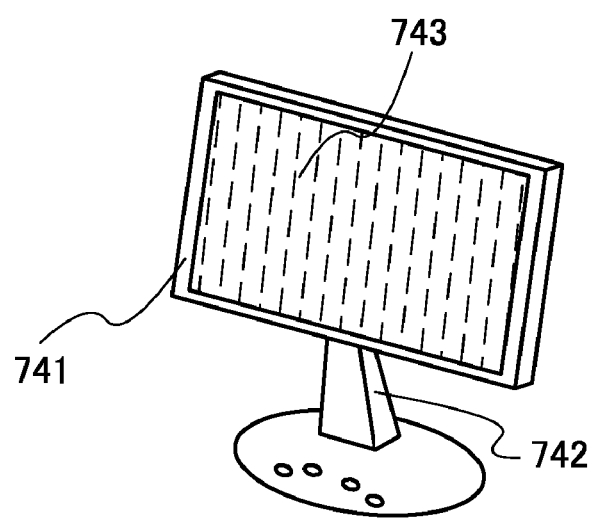

FIG. 11B illustrates a television device which is an example of a display device and includes a housing 741, a supporting base 742, a display portion 743, and the like.

Figure 12:
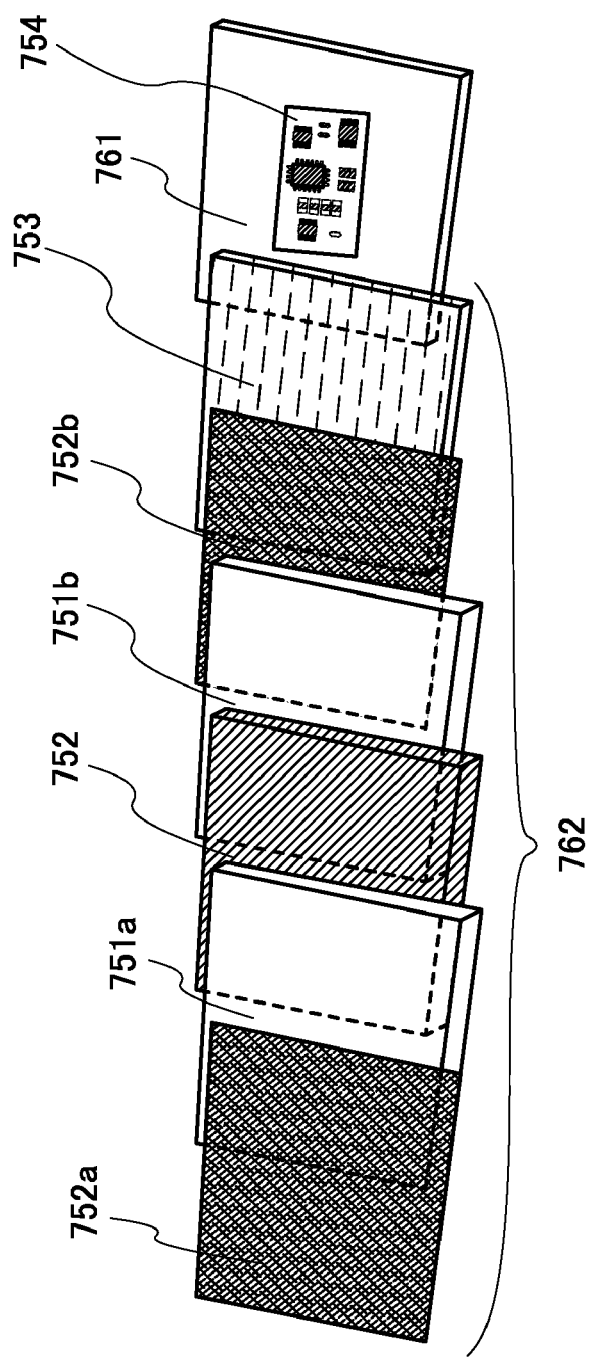
FIG. 12 illustrates a device on which a semiconductor device according to an embodiment of the present invention is mounted.

FIG. 12 illustrates a specific structure in the case of using a liquid crystal panel as a display portion 733 provided in a computer illustrated in FIG. 11A and as the display portion 743 of the display device illustrated in FIG. 11B.

A liquid crystal panel 762 illustrated in FIG. 12 is incorporated in a housing 761 and includes substrates 751a and 751b, a liquid crystal layer 752 interposed between the substrates 751a and 751b, polarizing filters 752a and 752b, a backlight 753, and the like. A housing 761 is provided with a sensor 754.

The sensor 754 which is manufactured using an embodiment of the present invention detects the amount of light from the backlight 753, and the information is fed back for adjusting luminance of the liquid crystal panel 762.

Figure 13A:
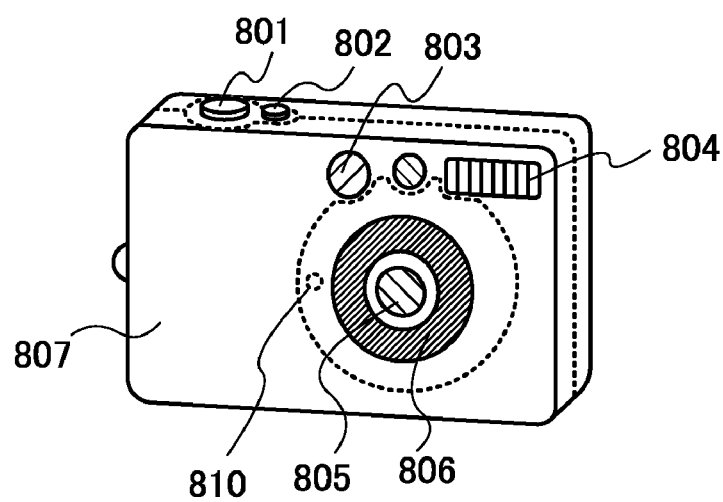
FIGS. 13A and 13B illustrate a device on which a semiconductor device according to an embodiment of the present invention is mounted.
Figure 13B:
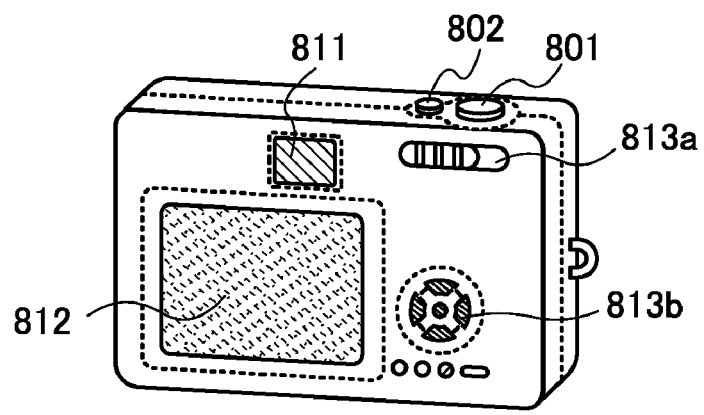

FIGS. 13A and 13B illustrate an example of a camera in which a sensor 810 using an embodiment of the present invention is included, for example a digital camera. FIG. 13A is a front perspective view seen from the front side of the digital camera, and FIG. 13B is a back perspective view seen from the back side of the digital camera. In FIG. 13A, the digital camera is provided with a release button 801, a main switch 802, a viewfinder 803, a flush portion 804, a lens 805, a lens barrel 806, a housing 807, and the sensor 810.

In addition, in FIG. 13B, a viewfinder eyepiece 811, a monitor 812, and operation buttons 813a and 813b are provided.

When the release button 801 is pressed down halfway, a focusing adjusting mechanism and an exposure adjusting mechanism operate, and when the release button is pressed down fully, a shutter opens.

The main switch 802 switches on or off of a power source of a digital camera by being pressed or rotated.

The viewfinder 803 is placed at the upper portion of the lens 805 of a front side of the digital camera and is a device for recognizing an area which is taken or a focus position from the viewfinder eyepiece 811 illustrated in FIG. 13B.

The flush portion 804 is placed at the upper portion of the front side of the digital camera, and when object luminance is low, supporting light is emitted as soon as the release button is pressed down so that the shutter is opened.

The lens 805 is placed at the front face of the digital camera. The lens is formed of a focusing lens, a zoom lens, or the like, and forms a photographing optical system with a shutter and aperture that are not illustrated. Note that an image pickup device such as charge coupled device (CCD) is provided at the back of the lens.

The lens barrel 806 is for moving a lens position to adjust the focus of the focusing lens, the zoom lens, and the like. In shooting, the lens barrel is slid out to move the lens 805 forward. In addition, when carrying the camera, the lens 805 is moved backward to make the camera compact. Note that a structure is employed in this embodiment, in which the lens barrel is slid out so that the object can be shot by being zoomed; however, the structure is not limited to this structure. Instead, a digital camera may employ a structure in which zoom shooting can be conducted without sliding out the lens barrel by a photographing optical system inside the housing 807.

The viewfinder eyepiece 811 provided at the upper portion of the back side of the digital camera is for looking therethrough when checking an area which is taken or a focus point.

The operation buttons 813 are buttons for a variety of functions that are provided at the rear side of the digital camera and include a set up button, a menu button, a display button, a functional button, a selection button, and the like.

When the sensor 810 to which an embodiment of the present invention is applied is incorporated in the camera illustrated in FIGS. 13A and 13B, the sensor 810 can detect whether light exists or not and the light intensity; accordingly, an exposure adjustment or the like of the camera can be performed. Since the sensor according to an embodiment of the present invention is thin, the device can be small even when the sensor is mounted on. Miniaturization of a component such as the sensor is effective particularly when the component is used for portable electronic appliances.

Figure 14:
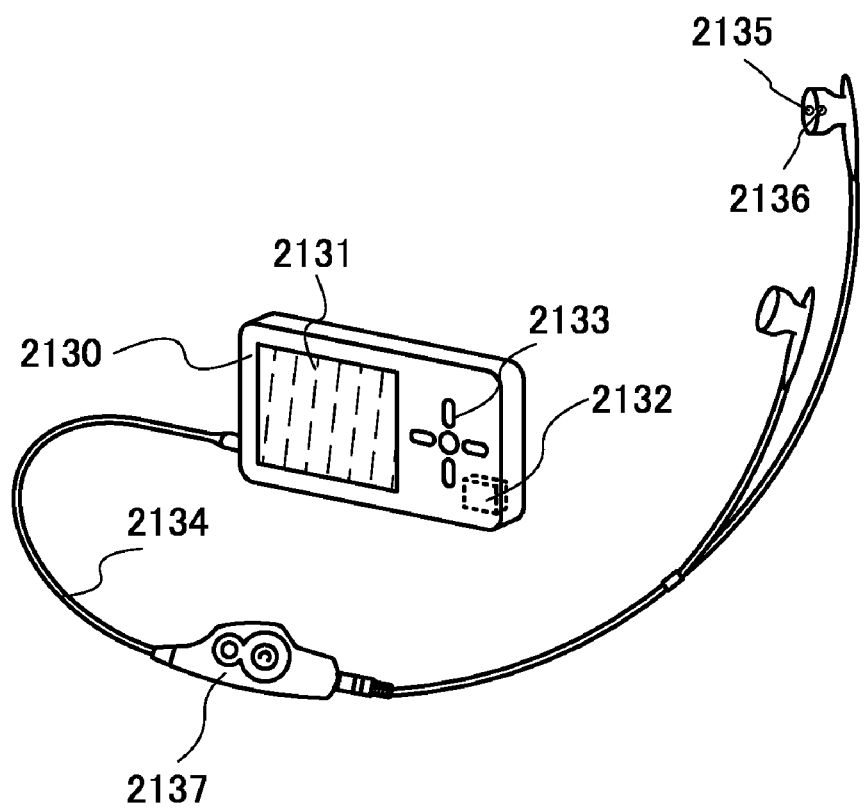
FIG. 14 illustrates a device on which a semiconductor device according to an embodiment of the present invention is mounted.

An embodiment of the present invention can also be applied to a portable information terminal which has a function of sound reproduction. FIG. 14 illustrates a digital player which is one typical example of an audio device. The digital player illustrated in FIG. 14 includes a main body 2130, a display portion 2131, a memory portion 2132, operating portions 2133, a pair of earphones 2134, a sensor 2135, a sensor 2136, a control portion 2137, and the like. Note that a headphone or a wireless earphone can be used instead of the earphones 2134.

Being an optical sensor which detects light, the sensor 2135 is provided in a region where light is blocked in the earphone when the earphone is worn. On the other hand, being a pressure-sensitive sensor, the sensor 2136 is provided in a region where the sensor touches the ear in the earphone when the earphone is worn. Whether or not the earphone is worn can be detected by the sensor 2135 which detects existence of light, and by the sensor 2136 which detects existence of pressure. The control portion 2137 controls the digital player with the information detected by the sensor 2135 and the sensor 2136 so that the digital player is turned on when the earphone is worn and the digital player is turned off when the earphone is not worn. Thus, even if the operating portions 2133 of the main body 2130 of the digital player is not controlled directly, on or off of the digital player can be switched automatically by whether or not the earphone is worn.

The color sensor according to an embodiment of the present invention can be used as the sensor 2138, which can detect ambient light and can control luminance of the display portion 2131 based on illuminance of detected ambient light.

Further, with the memory portion 2132, an image or sound (music) can be recorded and reproduced by controlling the operating portions 2133. Note that when white characters are displayed on a black background in the display portion 2131, power consumption can be suppressed. Note that a memory device which is provided in the memory portion 2132 may be removable.

The semiconductor device according to an embodiment of the present invention can also be applied to other electronic devices such as a projection TV and a navigation system. That is, the semiconductor device can be applied to anything that is required to detect light.

Note that this embodiment can be combined with any of Embodiment 1 to Embodiment 3 as appropriate.

This application is based on Japanese Patent Application serial no. 2008-083056 filed with Japan Patent Office on Mar. 27, 2008, the entire contents of which are hereby incorporated by reference.

What is claimed is:

1. A semiconductor device comprising:
first and second semiconductor integrated circuits bonded to a structure body in which a fibrous body is impregnated with an organic resin, the structure body having an opening, each of the first and second semiconductor integrated circuits comprising:
a light-transmitting substrate having a step section, the step section being on a first surface of the light-transmitting substrate;
a semiconductor integrated circuit portion including a photoelectric conversion element on a second surface of the light-transmitting substrate; and
a chromatic color light-transmitting resin layer which covers the first surface and the step section of the light-transmitting substrate,
wherein a width of the step section on the first surface is smaller than a width of the second surface of the light-transmitting substrate,
wherein a color of the chromatic color light-transmitting resin layer of the first semiconductor integrated circuit is different from a color of the chromatic color light-transmitting resin layer of the second semiconductor integrated circuit, and
wherein the first and second semiconductor integrated circuits are bonded to the structure body so that a portion of the step section is provided in the opening formed in the structure body.

2. The semiconductor device according to claim 1,
wherein a cross section of the light-transmitting substrate has a shape of an upside-down T in block letter.

3. The semiconductor device according to claim 1,
wherein the fibrous body is a woven fabric or a nonwoven fabric.

4. The semiconductor device according to claim 1,
wherein the fibrous body is formed using a polyvinyl alcohol fiber, a polyester fiber, a polyamide fiber, a polyethylene fiber, an aramid fiber, a polyparaphenylene benzobisoxazole fiber, a glass fiber, or a carbon fiber.

5. The semiconductor device according to claim 1,
wherein the organic resin is a thermosetting resin, a thermoplastic resin, or a photocurable resin.

6. The semiconductor device according to claim 5,
wherein the thermosetting resin is an epoxy resin, an unsaturated polyester resin, a polyimide resin, a bismaleimide-triazine resin, or a cyanate resin.

7. The semiconductor device according to claim 5,
wherein the thermoplastic resin is a polyphenylene oxide resin, a polyetherimide resin, or a fluorine resin.

8. The semiconductor device according to claim 1,
wherein a light-transmitting resin layer is stacked over the chromatic color light-transmitting resin layer.

9. The semiconductor device according to claim 8,
wherein a thickness of the light-transmitting resin layer is larger than that of the chromatic color light-transmitting resin layer.

10. The semiconductor device according to claim 1,
wherein the second surface and a top surface of the light-transmitting substrate are quadrangles, and an area of the second surface is larger than an area of the top surface.

11. The semiconductor device according to claim 1,
wherein each of the first and second semiconductor integrated circuits include an amplifier circuit for amplifying an output of the photoelectric conversion element, and
wherein the photoelectric conversion element has a layered structure in which a p-type semiconductor layer, an i-type semiconductor layer, and an n-type semiconductor layer are stacked.

12. The semiconductor device according to claim 1,
wherein the light-transmitting substrate is a glass substrate.

13. A semiconductor device comprising:
first and second semiconductor integrated circuits bonded to a structure body in which a fibrous body is impregnated with an organic resin, the structure body having an opening, each of the first and second semiconductor integrated circuits comprising:
a light-transmitting substrate one surface of which is a top surface and another surface of which is a bottom surface, the light-transmitting substrate having a step section which is an upper portion and the light-transmitting substrate having a cross section in which a thickness of the upper portion is smaller than a thickness of a lower portion;
a semiconductor integrated circuit portion including a photoelectric conversion element on the bottom surface of the light-transmitting substrate; and
a chromatic color light-transmitting resin layer which covers the top surface of the light-transmitting substrate,
wherein a color of the chromatic color light-transmitting resin layer of the first semiconductor integrated circuit is different from a color of the chromatic color light-transmitting resin layer of the second semiconductor integrated circuit, and
wherein the first and second semiconductor integrated circuits are bonded to the structure body so that a portion of the step section is provided in the opening formed in the structure body.

14. The semiconductor device according to claim 13,
wherein the cross section of the light-transmitting substrate has a shape of an upside-down T in block letter.

15. The semiconductor device according to claim 13,
wherein the fibrous body is a woven fabric or a nonwoven fabric.

16. The semiconductor device according to claim 13,
wherein the fibrous body is formed using a polyvinyl alcohol fiber, a polyester fiber, a polyamide fiber, a polyethylene fiber, an aramid fiber, a polyparaphenylene benzobisoxazole fiber, a glass fiber, or a carbon fiber.

17. The semiconductor device according to claim 13,
wherein the organic resin is a thermosetting resin, a thermoplastic resin, or a photocurable resin.

18. The semiconductor device according to claim 17,
wherein the thermosetting resin is an epoxy resin, an unsaturated polyester resin, a polyimide resin, a bismaleimide-triazine resin, or a cyanate resin.

19. The semiconductor device according to claim 17,
wherein the thermoplastic resin is a polyphenylene oxide resin, a polyetherimide resin, or a fluorine resin.

20. The semiconductor device according to claim 13,
wherein a light-transmitting resin layer is stacked over the chromatic color light-transmitting resin layer.

21. The semiconductor device according to claim 20,
wherein a thickness of the light-transmitting resin layer is larger than that of the chromatic color light-transmitting resin layer.

22. The semiconductor device according to claim 13,
wherein the bottom surface and the top surface of the light-transmitting substrate are quadrangles, and an area of the bottom surface is larger than an area of the top surface.

23. The semiconductor device according to claim 13,
wherein each of the first and second semiconductor integrated circuits include an amplifier circuit for amplifying an output of the photoelectric conversion element, and
wherein the photoelectric conversion element has a layered structure in which a p-type semiconductor layer, an i-type semiconductor layer, and an n-type semiconductor layer are stacked.

24. The semiconductor device according to claim 13,
wherein the light-transmitting substrate is a glass substrate.

25. A semiconductor device including at least a first semiconductor integrated circuit and a second semiconductor integrated circuit, each of the first semiconductor integrated circuit and the second semiconductor integrated circuit comprising:
a structure body having an opening wherein the structure body includes a fibrous body impregnated with an organic resin;
a light-transmitting substrate having a first surface and a second surface opposite to the first surface, wherein the light-transmitting substrate includes a projected portion on the first surface and a second portion adjacent to the projected portion;
a photoelectric conversion element on the second surface of the light-transmitting substrate; and
a chromatic color light-transmitting resin layer which covers the projected portion and the second portion adjacent to the light-transmitting substrate,
wherein the chromatic color light-transmitting resin layer of the first semiconductor integrated circuit has a different color from the chromatic color light-transmitting resin layer of the second semiconductor integrated circuit, and
wherein the structure body is bonded to the light-transmitting substrate in such a manner that at least the chromatic color light-transmitting resin layer is interposed between the structure body and the light-transmitting substrate, and the opening of the structure body corresponds to the projected portion.

26. The semiconductor device according to claim 25,
wherein a cross section of the light-transmitting substrate has a shape of an upside-down T in block letter.

27. The semiconductor device according to claim 25,
wherein the fibrous body is a woven fabric or a nonwoven fabric.

28. The semiconductor device according to claim 25,
wherein the fibrous body is formed using a polyvinyl alcohol fiber, a polyester fiber, a polyamide fiber, a polyethylene fiber, an aramid fiber, a polyparaphenylene benzobisoxazole fiber, a glass fiber, or a carbon fiber.

29. The semiconductor device according to claim 25,
wherein the organic resin is a thermosetting resin, a thermoplastic resin, or a photocurable resin.

30. The semiconductor device according to claim 29,
wherein the thermosetting resin is an epoxy resin, an unsaturated polyester resin, a polyimide resin, a bismaleimide-triazine resin, or a cyanate resin.

31. The semiconductor device according to claim 29,
wherein the thermoplastic resin is a polyphenylene oxide resin, a polyetherimide resin, or a fluorine resin.

32. The semiconductor device according to claim 25,
wherein a light-transmitting resin layer is stacked over the chromatic color light-transmitting resin layer.

33. The semiconductor device according to claim 32,
wherein a thickness of the light-transmitting resin layer is larger than that of the chromatic color light-transmitting resin layer.

34. The semiconductor device according to claim 25,
wherein the second surface and a top surface of the light-transmitting substrate are quadrangles, and an area of the second surface is larger than an area of the top surface.

35. The semiconductor device according to claim 25,
wherein each of the first and second semiconductor integrated circuits include an amplifier circuit for amplifying an output of the photoelectric conversion element, and
wherein the photoelectric conversion element has a layered structure in which a p-type semiconductor layer, an i-type semiconductor layer, and an n-type semiconductor layer are stacked.

36. The semiconductor device according to claim 25,
wherein the light-transmitting substrate is a glass substrate.

* * * * *